(12) United States Patent
Meschenmoser et al.

(10) Patent No.: US 10,442,053 B2
(45) Date of Patent: **\*Oct. 15, 2019**

(54) METHOD FOR HANDLING A LENS

(71) Applicant: Carl Zeiss Vision International GmbH, Aalen (DE)

(72) Inventors: Ralf Meschenmoser, Essingen (DE); Joerg Puetz, Aalen (DE); Thomas Schirle, Westhausen (DE); Norbert Kurz, Aalen (DE)

(73) Assignee: Carl Zeiss Vision International GmbH, Aalen (DE)

( \* ) Notice: Subject to any disclaimer, the term of this patent is extended or adjusted under 35 U.S.C. 154(b) by 586 days.

This patent is subject to a terminal disclaimer.

(21) Appl. No.: 15/208,384

(22) Filed: Jul. 12, 2016

(65) Prior Publication Data

US 2016/0318147 A1 Nov. 3, 2016

Related U.S. Application Data

(63) Continuation-in-part of application No. 14/470,842, filed on Aug. 27, 2014, now Pat. No. 9,421,659,
(Continued)

(30) Foreign Application Priority Data

Feb. 27, 2012 (DE) .......................... 10 2012 202 965

(51) Int. Cl.
*B24B 13/005* (2006.01)
*G02B 1/11* (2015.01)
(Continued)

(52) U.S. Cl.
CPC ............ *B24B 13/005* (2013.01); *B05D 1/005* (2013.01); *B05D 1/18* (2013.01);
(Continued)

(58) Field of Classification Search
CPC ........ B24B 13/005; B05D 1/005; B05D 1/18; B29D 11/00884; B29D 11/00942;
(Continued)

(56) References Cited

U.S. PATENT DOCUMENTS

| | | | |
|---|---|---|---|
| 4,089,102 A | 5/1978 | Soper et al. | |
| 4,669,226 A | 6/1987 | Mandler | |
| 5,514,214 A * | 5/1996 | Joel .......................... | B05D 1/005 118/300 |
| 5,766,354 A * | 6/1998 | Ohmori ................... | B05C 11/08 118/319 |

(Continued)

FOREIGN PATENT DOCUMENTS

| | | |
|---|---|---|
| DE | 296 08 877 U1 | 8/1996 |
| DE | 10 2009 004 379 A1 | 7/2010 |

(Continued)

OTHER PUBLICATIONS

International Search Report dated May 23, 2013 of international application PCT/EP2013/053839 on which this application is based.
(Continued)

*Primary Examiner* — James M Mellott
(74) *Attorney, Agent, or Firm* — Walter Ottesen, P.A.

(57) ABSTRACT

A carrier device (10) is for handling a lens (12) which is received therein and which has a lateral edge (21), in particular for handling an eyeglass lens (12) in a machining or finishing process. The carrier device (10) comprises a main body (14) and has a connecting member (24) for releasably connecting the main body (14) to the received lens (12). The connecting member (24) forms, with the main body (14), a protective cover (15) surrounding the lateral edge (21) of the received lens (12) and a surface (30) of the received lens (12) directed toward the main body (14). The connecting member (24) is releasably connected to the main body (14).

21 Claims, 22 Drawing Sheets

Related U.S. Application Data which is a continuation of application No. PCT/EP2013/053839, filed on Feb. 26, 2013.

(60) Provisional application No. 61/603,591, filed on Feb. 27, 2012.

(51) Int. Cl.
*C23C 14/24* (2006.01)
*B05D 1/00* (2006.01)
*B05D 1/18* (2006.01)
*B29D 11/00* (2006.01)

(52) U.S. Cl.
CPC .. *B29D 11/00884* (2013.01); *B29D 11/00942* (2013.01); *C23C 14/24* (2013.01); *G02B 1/11* (2013.01); *Y10T 29/49995* (2015.01); *Y10T 83/04* (2015.04)

(58) Field of Classification Search
CPC ..... C23C 14/24; G02B 1/11; Y10T 29/49995; Y10T 83/04
See application file for complete search history.

(56) References Cited

U.S. PATENT DOCUMENTS

| | | |
|---|---|---|
| 5,951,375 A | 9/1999 | Mandler |
| 8,613,982 B2 | 12/2013 | Takahashi et al. |
| 2008/0007849 A1* | 1/2008 | Meschenmoser ...... B23Q 3/084 359/819 |
| 2010/0102025 A1* | 4/2010 | Eagerton ............. C03C 17/3417 216/13 |
| 2012/0013030 A1 | 1/2012 | Kadowaki et al. |

FOREIGN PATENT DOCUMENTS

| | | |
|---|---|---|
| EP | 1 887 586 A1 | 2/2008 |
| JP | 2007-47410 A | 2/2007 |
| WO | 2006/059659 A1 | 6/2006 |

OTHER PUBLICATIONS

International Preliminary Report on Patentability and Written Opinion of the international searching authority dated Jun. 13, 2014 in international patent application PCT/EP2013/053839 on which the claim of priority is based.

* cited by examiner

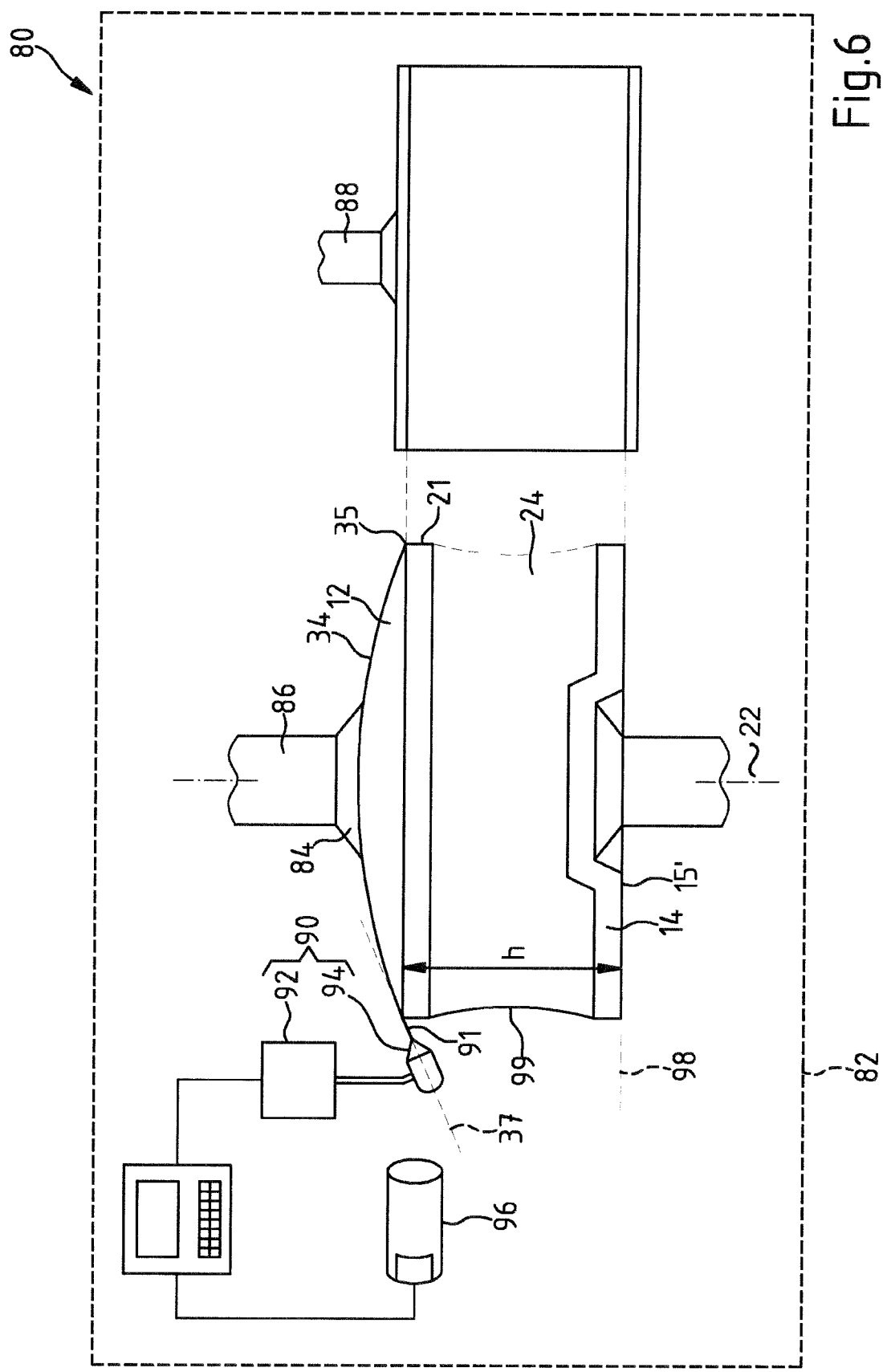

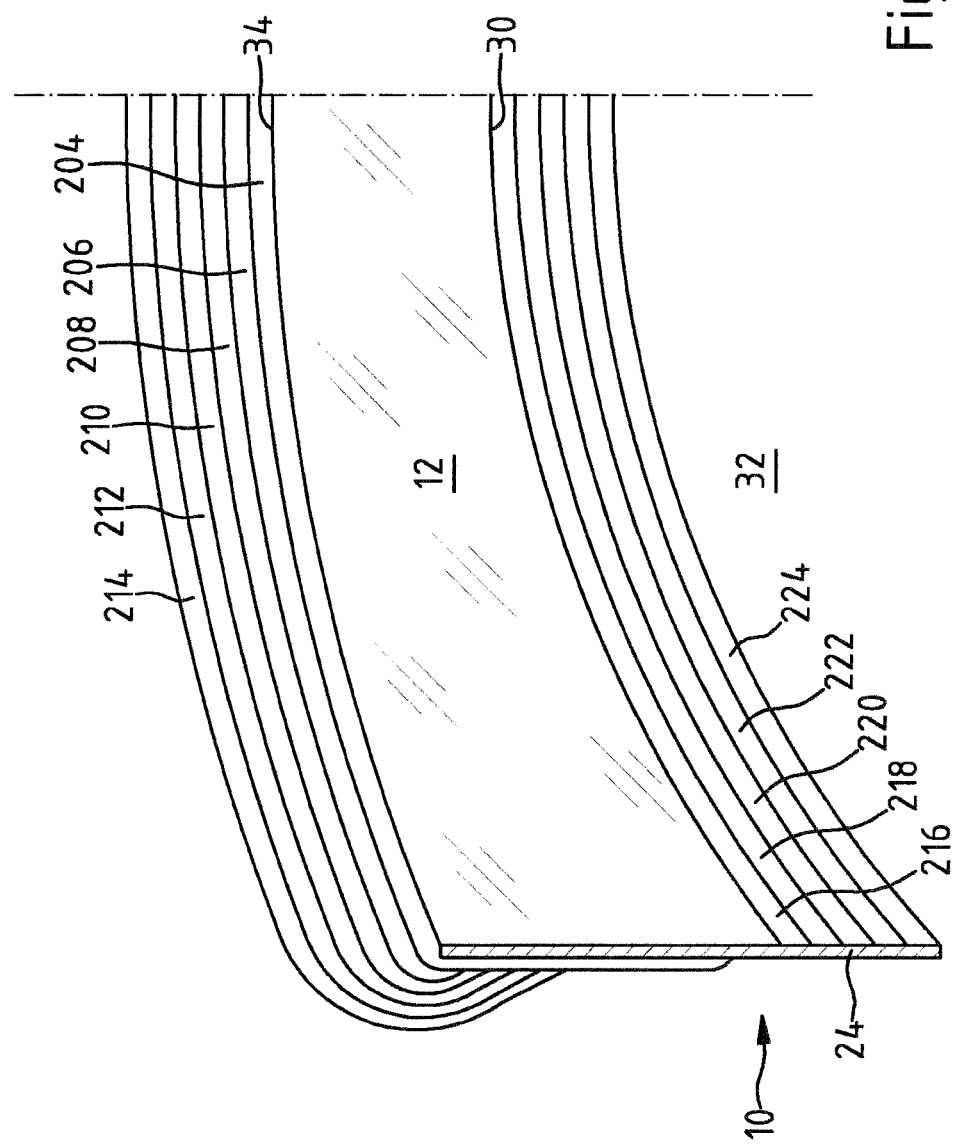

METHOD FOR HANDLING A LENS

CROSS REFERENCE TO RELATED APPLICATIONS

This application is a continuation-in-part application of U.S. patent application Ser. No. 14/470,842, filed Aug. 27, 2014, which is a continuation application of international patent application PCT/EP2013/053839, filed Feb. 26, 2013, which designates the United States and claims priority from U.S. Provisional Application No. 61/603,591, filed Feb. 27, 2012, and German patent application 10 2012 202 965.6 filed Feb. 27, 2012. The present continuation-in-part application claims priority to each of the above applications and incorporates herein the entire contents thereof by reference.

FIELD OF THE INVENTION

The invention relates to a method for handling a lens which is received in a carrier device and which has a lateral edge, in particular for handling an eyeglass lens in a machining or finishing process. The carrier device has a main body, and it has a connecting member for releasably connecting the main body to the received lens. The connecting member forms, with the main body, a protective cover surrounding a surface of the received lens directed toward the main body and, as a preferred option, also the lateral edge of the received lens. Moreover, the invention also relates to a method for machining or finishing a lens, in particular an eyeglass lens, in which method the lens, in a packaging system in the form of a carrier device with an eyeglass lens, undergoes a process step or a plurality of process steps.

BACKGROUND OF THE INVENTION

Within the meaning of the invention, a lens is to be understood as a glass or plastic body that has two optically active surfaces, that is, light-refracting surfaces, lying opposite each other. A lens within the meaning of the invention is in particular an eyeglass lens designed to be fitted in an eyeglass frame. The term eyeglass lens also extends in the present case to what are called eyeglass lens blanks, that is, a usually prefabricated piece of material for producing a lens in any state prior to completion of the surface machining, and also to what are called semi-finished products in the form of a lens blank with only one surface that has been fully optically machined. Such semi-finished products are also referred to as semi-finished eyeglass lenses.

Lenses, in particular eyeglass lenses, are often finished by coating them with lacquers. Here, the problem arises that often only a front or back surface of the lens, for example, only the lens surface directed away from the eye of an eyeglass wearer or the lens surface directed toward the eye, is intended to be coated with a lacquer, without the other surfaces of the lens coming into contact with this lacquer.

A carrier device of the type mentioned at the outset is known from EP 1 887 586 A1. The latter proposes a handling procedure in which a lens with a lens surface is received on a main body made of a thermoplastic, for example, of polyurethane (PUR). The lens surface received on the main body is for this purpose covered with a protective film. This protective film acts as an adhesive layer by which the lens, with the lens surface in question, is secured on the main body after a heating operation.

U.S. Pat. No. 8,613,982 describes a device for finishing eyeglass lenses, in which an eyeglass lens lies with its back surface on the front end of a rotating shaft. For finishing by chemical wet-coating, the front surface of the eyeglass lens rotating with the shaft is coated with a coating lacquer. In order to avoid a situation where the lacquer, on account of the rotation movement of the eyeglass lens, reaches the lateral edge surface and back surface thereof, the lacquer is caught in the edge area of the eyeglass lens with a spatula.

SUMMARY OF THE INVENTION

An object of the invention is to provide a method for finishing a lens utilizing a carrier device which permits handling of a lens in a production facility and in which a lens surface can be machined, in particular finished, in a process step or in a plurality of process steps, and the other lens surface is protected against soiling and contamination.

The method of the invention is achieved with a carrier device which is of the type mentioned at the outset and in which the connecting member is releasably connected to the main body.

This allows for using one and the same main body with different connecting members which are adapted to the geometry of a lens in a carrier system for a lens to be processed in an installation for lens processing.

In a carrier device according to the invention, it is possible to machine and finish lenses having a lens surface that cannot be blocked, as a result of which it is not possible, or is possible only with very great effort, to receive and hold the lens via this lens surface. In particular, lens surfaces provided with a hydrophobic surface coat are unsuitable for blocking. By contrast, the carrier device according to the invention means that lenses with an already machined lens surface, in particular with a lens surface that has already been fully coated in elaborate finishing processes, can be handled with a protective cover surrounding this lens surface and also, as an option, additionally the edge of the lens. This has the effect that a lens received in the carrier device can be finished by chemical wet-coating, and, in so doing, the surface of the lens directed toward the main body is protected against soiling by the lacquers and solutions used in the chemical wet-coating.

The connecting member can serve to hold a lens in the carrier device. A lens can thus be received in the carrier device in such a way that a coated lens surface that faces into the hollow space is not touched.

It is in particular a concept of the invention that the protective cover forms a hollow space together with a lens received in the carrier device. Since the hollow space is closed off and/or sealed, a lens received in a carrier device can be machined or finished by means of the carrier device as a whole being immersed into an immersion bath composed of lacquers, solutions or cleaning liquids, in such a way that the lens surface facing into the interior of the hollow space does not come into contact with these liquids.

However, it is also a concept of the invention to design the main body with at least one opening for feeding fluid into the hollow space or removing fluid from the hollow space. This measure means for example that, when a lens is received in the carrier device, an inert gas can be applied to the surface of the lens facing toward the main body, while the lens surface lying opposite this lens surface is finished in a chemical process step.

It is in particular a concept of the invention that the opening in the main body of a carrier device can be alternately released and blocked. In such a carrier device, a fluid located in the hollow space can then be replaced while a surface of a lens received in the carrier device is being machined.

If the main body has at least one further opening, through which fluid can be removed from the hollow space or fed into the hollow space, it is possible, when a lens is received in the carrier device, to use a stream of fluid to cool the surface facing toward the main body while the lens is being finished. To ensure that the stream of fluid can be controlled, it is advantageous if the further opening can be alternately released or closed.

It is advantageous to design the main body with an attachment member that permits the attachment of the main body to a coupling member of a unit of a machining and/or conditioning system in a processing station of a production facility. Such a unit in a machining and/or conditioning system can, for example, be a spindle and/or a mechanism for feeding fluid through an opening formed in the main body. The attachment member is expediently designed as a coupling part, preferably as part of a quick-action coupling, as part of a bayonet catch or as part of a snap-fit connection, which cooperates with a coupling member that is provided on the unit of the machining and/or conditioning system and that is designed as part of a quick-action coupling, as a mating part of a bayonet catch or as a mating part of a snap-fit connection. This ensures the rapid exchange of carrier devices and machining and/or conditioning systems in a production facility for eyeglass lenses. The attachment member can also be a depression or a recess in the main body, permitting a force-fit connection, for example, a vacuum connection by suction with a suction cup, and/or a form-fit connection with a corresponding machining system and/or conditioning system unit. In particular, it is possible to provide the attachment member in the form of a thread in the main body.

It is in particular a concept of the invention that the attachment member defines a machine interface, with a positional reference point fixed on the main body, for a machining and/or conditioning system. This measure dispenses with the need for multiple measurements of the topography and the position of eyeglass lenses in a production facility with different machining and/or conditioning systems.

It is also a concept of the invention to design the carrier device with a support member for supporting the lens via the surface thereof directed toward the main body. The support member has a portion on which the lens surface directed toward the main body can be placed. A force introduced into this portion from the lens is transferred into the main body by means of the support member.

This has the effect that a lens received in the carrier device can be heated in a thermal cycle to beyond the glass transition temperature $T_G$ without undergoing excessive deformation on account of its own weight. It is thus possible in particular for the carrier device to receive eyeglass lenses having a very thin lens thickness, since these can be stabilized in the carrier device by means of the support member.

The support member can be a spring secured on the main body, for example, an annular spring which, when a lens is received in the carrier device, bears on the lens surface facing into the hollow space. With a large number of these support members in the carrier device, it is possible to ensure that, when a lens is received in the carrier device, the lens surface directed toward the main body is subject to supporting forces that are uniformly distributed across the surface.

The support member can also be a spring with a spring body which is secured on the main body and which has at least one spring tongue which extends from a retaining portion to the lens surface directed toward the main body, and with which the lens surface directed toward the main body is supported on a convexly curved portion. If the spring is made of a plastic, in particular of polytetrafluoroethylene (PTFE), it is possible to ensure that, when a lens is received in a carrier device, the surface which is bearing on the spring is not mechanically impaired.

The support member can also have a ram, guided in a linearly movable manner on the main body, and can comprise a spring mechanism which, when subjected to a force acting in the direction of the main body, introduces a supporting force into the ram in order to support the lens on a surface directed toward the main body. It is also advantageous here if the ram is made of a plastic, in particular of PTFE, in order to ensure that a lens received in a carrier device does not suffer undesired deformation or mechanical damage.

In order to cushion the ram, the spring mechanism can be designed as a mechanical spring mechanism with a helical spring. As an alternative to this, it is also possible to design the spring mechanism as a pneumatic spring mechanism, in which there is a gas cushion acting on a piston. In addition, it is possible to design the spring mechanism as a hydraulic spring mechanism that contains a hydraulic liquid acting on a piston.

The support member in a carrier device according to the invention can also be a hollow body received on the main body, made preferably of PTFE and having a wall designed as a bellows. This hollow body has a portion, preferably designated as a suction cup, on which a lens in the carrier device can bear via a surface facing toward the main body.

A carrier device can also contain, as support member, a gel cushion which is received on the main body and which is filled with a gel material, for example, with agar-agar or with water to which acrylic polymer crystals have been mixed. As the gel material in a gel cushion, it is particularly advantageous to use a magnetostrictive or ferromagnetic gel material that hardens when subjected to a magnetic field.

It is thus possible, in an installation for finishing lenses, for example, in a production facility for eyeglass lenses, to adjust the mechanical properties of the gel material for a specific finishing process and to choose different properties for different finishing steps.

It is also a concept of the invention for a support member, in a carrier device according to the invention, to be in the form of a plastics body made of UV adhesive. It is in particular a concept of the invention for the support member, in a carrier device according to the invention, to be in the form of a fluid volume which is arranged in the carrier device between the main body and the lens and which is subjected to an overpressure. To allow the overpressure in the hollow space to be adjusted, it is advantageous if the main body comprises a valve for subjecting the fluid volume to an overpressure.

A suitable support member in a carrier device according to the invention is also a ball cushion having an envelope which is filled with a multiplicity of balls. This envelope is attached to a valve in the main body, via which valve a gas volume can be suctioned off from the envelope in order to generate an underpressure, such that the ball cushion hardens. The main body of a carrier device according to the invention can also have at least one opening for feeding fluid into the hollow space or for removing fluid from the hollow space. In particular, the main body can have an opening for feeding gaseous fluid into the hollow space, and a further opening for removing fluid from the hollow space. By means of this measure, the hollow space formed in a carrier device according to the invention, between a lens received therein and the main body, can be flushed with a fluid in order to remove heat from the lens surface facing into the hollow space or in order to heat the lens by delivering heat through this surface.

The support member in a carrier device according to the invention can also be a PTFE leaf spring positioned on the main body of the carrier device, a PTFE spring-thrust piece secured there, an elastomer buffer arranged on the main body, a foam ring positioned on the main body, preferably mounted on the main body, or else a gas balloon arranged on the main body.

The connecting member in a carrier device according to the invention can also be a clamping ring that engages around the lateral edge surface of the lens. It is advantageous if this clamping ring is flush with the edge of the lens surface directed away from the main body. The clamping ring preferably has a front face which, when the lens is received in the carrier device, continuously adjoins the lens surface directed away from the main body. The clamping ring is preferably made of plastic. The inventors have found that thermo-plastic elastomers in particular are highly suitable as the material for a clamping ring, because in this way the hollow space in the carrier device can be closed with a good sealing action. However, it is likewise possible to provide a clamping ring made from a metal or to make the clamping ring from the material PFTE.

In order to ensure that the clamping ring and the lens surface directed away from the main body are continuous, it is advantageous to measure the carrier device with a lens received therein and then to cut the clamping ring to size in the carrier device. This measure in fact permits a very exact adaptation of the clamping ring to the edge of the lens surface directed away from the main body. In particular, this measure permits the exact adaptation of the clamping ring to the edge of a lens surface designed as a free-form surface, which has no rotational symmetry and whose edge does not have a circular shape, but is instead elliptic, for example.

According to the invention, the connecting member can also be designed as an adhesive tape placed around the lateral edge of the lens. To permit stable securing of the lens on the main body, it is advantageous if the adhesive tape placed around the lateral edge of the lens is subjected to a tensile stress. In this way, the adhesive tape forms a narrowed contour between the main body and the lateral edge of a received lens. Extensive tests have shown that a tensile stress is useful here that causes a 10% stretching of the adhesive tape, preferably a 3 to 6% stretching of the adhesive tape. The inventors have discovered that a lens can be arranged with great stability in a carrier device if the adhesive tape is placed 1.5 to 2 times, preferably 1.8 times, around the lateral edge surface of the lens with this tensile stress.

If the narrow side of the adhesive tape placed around the lens continuously adjoins, preferably continuously and tangentially adjoins, the lens surface directed away from the main body, that is, is not only flush with the edge of this lens but also more or less continues the profile of the lens surface directed away from the main body, it is possible, by means of rotational coating, that is, spin coating of a lens received in a carrier device, that this surface can be covered with high-quality lacquer layers that have uniform thickness and that do not have any undesired gaps in the lacquer at the lens edge. Rotational coating or spin coating is generally understood here as a method of coating a substrate, in which method a liquid is applied for the coating while the substrate rotates about an axis, so that the applied liquid spreads out under the effect of the centrifugal force and forms a uniform coating film on the substrate.

In order to ensure that the connecting member, for example, the adhesive tape placed around the lens, exactly and continuously adjoins the lens surface directed away from the main body, it is expedient to precisely measure the carrier device, with a lens received therein, in order then to cut the connecting member to size in the carrier device according to the measurement result. According to the invention, this cutting to size can be done in particular by means of a cutting mechanism, with removal of a portion which, on the lateral edge of a lens, protrudes beyond the edge of the surface directed away from the main body. It is a concept of the invention to cut the connecting member to size using a cutting knife which, during a rotational relative movement of main body and cutting mechanism, bears tangentially on the surface of the eyeglass lens directed away from the main body. By means of this measure, it is possible to create a continuous transition from a front surface of the connecting member, adjoining a lens in a carrier device, to the lens surface directed away from the main body.

It is expedient if the main body of the carrier device is provided with a seat for the engagement of a centering mandrel, or if it has a centering mandrel for engagement in a centering-mandrel seat formed on a spindle. In this way, a lens received in a carrier device according to the invention can be easily centered on a spindle.

The arrangement of an information carrier on that side of the main body facing into the hollow space makes it possible, using a suitable device, to read out information from the information carrier and/or write in information into the information carrier through a lens received in a carrier device according to the invention.

A lens received in a carrier device according to the invention forms, with the carrier device, a packaging system in which lenses can safely undergo various successive machining and/or finishing processes in an installation.

In such a packaging system, a lens with a lens surface protected against contamination and soiling can in fact be moved through one or more processing stations by a computer-controlled transport device.

A carrier device according to the invention permits the machining or finishing of lenses in a process in which the hollow space, formed between the main body and a lens received in the carrier device, is flushed with a fluid, in particular with air, in order to remove heat from the lens surface directed toward the main body or to introduce heat through this surface into the lens.

Extensive tests have shown that, if a lens is received in a carrier device according to the invention, and if the connecting member covers the lateral edge surface of the lens in such a way that the connecting member is flush with the edge of the lens surface directed away from the main body, it is possible to produce a homogeneous and uniformly distributed layer of lacquer by means of spin coating, if the packaging system composed of carrier system and lens is exposed to coating fluid, for example, to lacquer, with a vertical rotation axis extending through a center of the lens, for example, a vertex of an optically active surface of the lens, at a speed of rotation of between 300 rpm and 800 rpm, preferably between 400 rpm and 600 rpm.

The coating fluid, expediently in the form of liquid droplets or in the form of a liquid jet, is applied in the direction of the rotation axis to a vertex of the surface or to an area lying around the vertex in the surface. However, it is also a concept of the invention to apply coating fluid to a lens in a packaging system composed of carrier device and lens by a process in which the packaging system is rotated about a rotation axis which extends through a vertex of a surface of the lens, and this surface of the lens is thereby exposed to one or more fluid jets of coating fluid. Moreover, it is a concept of the invention for a packaging system composed of carrier device and lens to be rotated, with the lens being immersed obliquely into a coating fluid as far as a vertex, about a rotation axis which extends through this vertex of the surface of the lens, in order to apply a coating to this surface of the lens.

In a packaging system composed of carrier device and lens, it is possible for a lens to undergo various process steps, for example, UV hardening, post-hardening with ambient air, high-voltage activation or IR drying. It is thereby possible, in such a process step, for the hollow space to be flushed at least partially with a fluid, for example, with air, in order to remove heat from the lens surface directed toward the main body.

In a production facility for lenses, it is possible for a lens, in a packaging system composed of a carrier device according to the invention and of a lens, to undergo the following process steps in particular: cleaning a surface of the lens; flushing a surface of the lens, in particular flushing with water, in particular flushing with fully deionized water of which the conductance value L is preferably L<0.5 µS, and which expediently has a temperature T in the range of 30° C.≤T≤45° C. or also 30° C.≤T≤60° C.; polishing a surface of the lens with a cleaning agent; mechanically brushing a surface of the lens; activating the substrate of a surface of the lens with alkaline solution; high-pressure cleaning of a surface of the lens using a liquid that can be applied at a high pressure P, which can be between 120 bar and 180 bar or even up to 200 bar or more; drying a surface of the lens in a warm air stream, which can have a temperature T of up to T=80° C.; measuring the enveloping surface area and the z-height of a surface of the lens; priming a surface of the lens with adhesion promoter; drying a surface of the lens in a conditioned laminar flow, that is, a laminar flow of a gas which has a defined, preferably regulated moisture content and of which the temperature T is exactly set, preferably regulated; applying functional lacquer to a surface of the lens; UV-hardening of functional lacquer on a surface of the lens; post-hardening of functional lacquer on a surface of the lens with ambient air; high-voltage activation of functional lacquer on a surface of the lens, by means of gas discharges that are generated at a voltage U with U≈40 kV or more; activation of functional lacquer on a surface of the lens with alkaline solution; applying protective lacquer to a surface of the lens; IR-drying of the lens; post-hardening of protective lacquer on a surface of the lens with ambient air.

A first embodiment of the method of the invention is a method for finishing an eyeglass lens with a packaging system which includes a carrier device and the eyeglass lens accommodated thereon, the eyeglass lens having first and second lens surfaces and a lateral peripheral edge delimiting the first and second lens surfaces and defining an edge surface extending between the first and second lens surfaces; the carrier device including: a main body; a singular annular connecting member directly contact engaging both the main body and the lens and being configured to releasably connect the main body to the lens; the lens being accommodated in the carrier device so as to cause the first lens surface to face toward the main body and the second lens surface to face away from the main body; the main body and the connecting member conjointly defining a protective cover surrounding the first lens surface thereof facing toward the main body; the connecting member being in contact engagement with all of the edge surface when the lens is held in the carrier device so as to protect the edge surface from damage during the handling of the lens; the connecting member being in contact engagement with the edge surface when the lens is held in the carrier device; preferably, the connecting member being in contact engagement with all of the edge surface when the lens is held in the carrier device so as to protect the edge surface from damage during the handling of the lens; and, the connecting member being one of: an adhesive tape placed around the lateral edge of the lens and a clamping ring engaging around the lateral edge of the lens; the method including the step of: moving the packaging system to a processing station configured as a coating station and coating the second lens surface in the coating station.

A second embodiment of the method of the invention is a method for wet-coating an eyeglass lens with a processing system including a fluid container for holding the fluid for wet-coating the eyeglass lens and a packaging system which defines a rotational axis and includes a carrier device and the eyeglass lens accommodated thereon, the eyeglass lens having first and second lens surfaces and a lateral peripheral edge delimiting the first and second lens surfaces and defining an edge surface extending between the first and second lens surfaces; the carrier device including: a main body; a singular annular connecting member directly contact engaging both the main body and the lens and being configured to releasably connect the main body to the lens; the lens being accommodated in the carrier device so as to cause the first lens surface to face toward the main body and the second lens surface to face away from the main body; the main body and the connecting member conjointly defining a protective cover surrounding the first lens surface thereof facing toward the main body; the connecting member being in contact engagement with all of the edge surface when the lens is held in the carrier device so as to protect the edge surface from damage during the handling of the lens; the connecting member being in contact engagement with the edge surface when the lens is held in the carrier device; preferably, the connecting member being in contact engagement with all of the edge surface when the lens is held in the carrier device so as to protect the edge surface from damage during the handling of the lens; the connecting member being one of: an adhesive tape placed around the lateral edge of the lens and a clamping ring engaging around the lateral edge of the lens; and, the fluid container including a conduit having several nozzles for directing the fluid to the second lens surface; the method including the following steps:

lowering the packaging system into the fluid container above the nozzles of the conduit and the surface of the fluid; and, moving fluid from the fluid container into the conduit and through the nozzles toward the second surface of the eyeglass lens while simultaneously rotating the packaging system about the rotational axis to drive the coating fluid under the effect of centrifugal force to the edge of the eyeglass lens thereby ensuring that the layer of fluid applied to the eyeglass lens adheres to the second surface with a uniform layer thickness.

A third embodiment of the method of the invention is a method for coating an eyeglass lens with a processing system including a vapor deposition system for vapor depositing a coating on the eyeglass lens and a packaging system which includes a carrier device and the eyeglass lens accommodated thereon, the eyeglass lens having first and second lens surfaces and a lateral peripheral edge delimiting the first and second lens surfaces and defining an edge surface extending between the first and second lens surfaces and each of the first and second lens surfaces defining a surface centroid; the carrier device including: a main body; a singular annular connecting member directly contact engaging both the main body and the lens and being configured to releasably connect the main body to the lens; the lens being accommodated in the carrier device so as to cause the first lens surface to face toward the main body and the second lens surface to face away from the main body; the main body and the connecting member conjointly defining a protective cover surrounding the first lens surface thereof facing toward the main body; the connecting member being in contact engagement with all of the edge surface when the lens is held in the carrier device so as to protect the edge surface from damage during the handling of the lens; the connecting member being in contact engagement with the edge surface when the lens is held in the carrier device; preferably, the connecting member being in contact engagement with all of the edge surface when the lens is held in the carrier device so as to protect the edge surface from damage during the handling of the lens; the connecting member being one of: an adhesive tape placed around the lateral edge of the lens and a clamping ring engaging around the lateral edge of the lens; and, the vapor deposition system including a calotte having an inner surface and a vapor deposition device for directing vaporized coating material to the second lens surface; the method including the following steps:

attaching a plurality of the packaging systems to the inner surface of the calotte so as to cause the second lens surface to face toward the vapor deposition device;

adjusting the packing systems so as to cause the centroid of corresponding ones of the second lens surfaces to lie in an imaginary spherical surface concentric with the inner surface of the calotte; and, simultaneously vapor depositing the coating material onto the second lens surfaces of corresponding ones of the eyeglass lenses.

A fourth embodiment of the method of the invention is a method for wet-coating an eyeglass lens with a processing system for wet-coating the eyeglass lens with a fluid and a packaging system which defines a rotational axis and includes a carrier device and the eyeglass lens accommodated thereon, the eyeglass lens having first and second lens surfaces and a lateral peripheral edge delimiting the first and second lens surfaces and defining an edge surface extending between the first and second lens surfaces; the carrier device including: a main body; a singular annular connecting member directly contact engaging both the main body and the lens and being configured to releasably connect the main body to the lens; the lens having a vertex and being accommodated in the carrier device so as to cause the first lens surface to face toward the main body and the second lens surface to face away from the main body; the main body and the connecting member conjointly defining a protective cover surrounding the first lens surface thereof facing toward the main body; the connecting member being in contact engagement with all of the edge surface when the lens is held in the carrier device so as to protect the edge surface from damage during the handling of the lens; the connecting member being in contact engagement with the edge surface when the lens is held in the carrier device; preferably, the connecting member being in contact engagement with all of the edge surface when the lens is held in the carrier device so as to protect the edge surface from damage during the handling of the lens; the connecting member being one of: an adhesive tape placed around the lateral edge of the lens and a clamping ring engaging around the lateral edge of the lens; and, the processing system including a container defining a vertical axis and being configured for receiving and holding the fluid for wet-coating the second lens surface of the eyeglass lens and a circulating arrangement for circulating the fluid through the container; the method including the following steps:

circulating the fluid through the container;

immersing the carrier device with the eyeglass lens obliquely into the fluid so as to cause the rotational axis and the vertical axis to conjointly define an angle $\beta$ and so as to cause the eyeglass lens to be immersed up to the vertex thereof; and, rotating the carrier device with the eyeglass lens about the rotational axis so as to drive the fluid under the effect of centrifugal force to the edge of the eyeglass lens.

BRIEF DESCRIPTION OF THE DRAWINGS

The invention will now be described with reference to the drawings wherein:

FIG. 6 shows an installation for equipping a carrier device with an eyeglass lens;

FIG. 8 shows a partial section of a coated eyeglass lens in a carrier device;

DESCRIPTION OF THE PREFERRED EMBODIMENTS OF THE INVENTION

Figure 1:
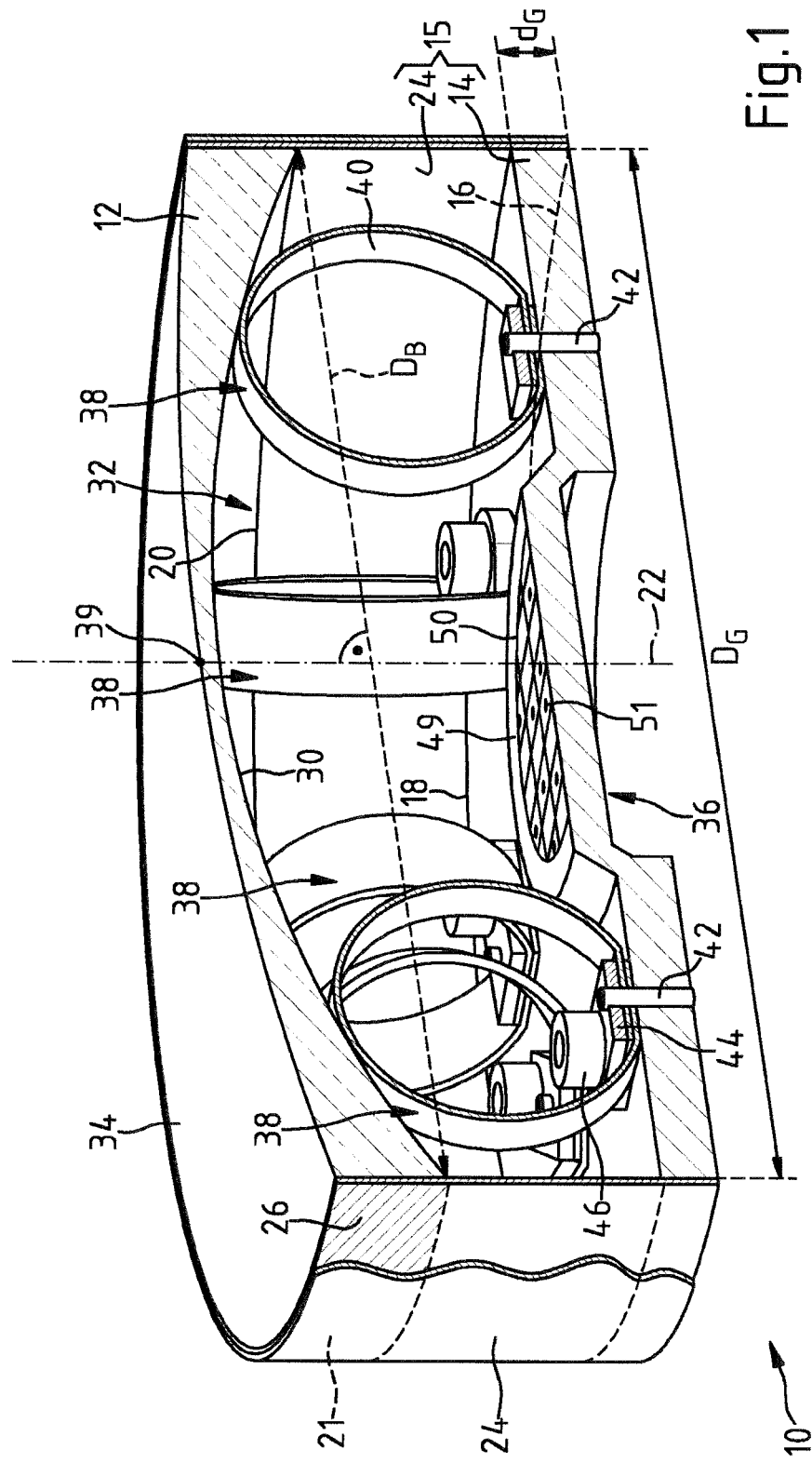
FIG. 1 shows a three-dimensional section of a first carrier device with an eyeglass lens.

FIG. 1 shows carrier device 10 with a lens in the form of an eyeglass lens 12, which has a negative refractive power. The carrier device 10 serves for the handling of the eyeglass lens 12 in a machining process, in particular a finishing process in a production facility for eyeglass lenses. The carrier device 10 is suitable in particular for receiving an eyeglass lens in a plurality of successive production processes, in particular finishing processes. The eyeglass lens 12 can be a plastic eyeglass lens, for example. However, the carrier device 10 can also in principle receive eyeglass lenses made of another lens material, for example, of mineral glass. The carrier device 10 is also suitable for receiving eyeglass lenses whose refractive power is positive.

In the carrier device 10, the eyeglass lens 12 is secured on a main body 14. The main body 14 is designed as a flat, mechanically stable plate with a thickness $d_G$. The main body 14 is made of aluminum. This material is easy to machine, comparatively inexpensive and, for process steps in the field of eyeglass lens production, has sufficient chemical, thermal and mechanical stability. However, the main body can in principle also be made of another suitable material that has sufficient chemical, thermal and mechanical stability for finishing processes in eyeglass lens production. The main body 14 has a lateral edge surface 16 with a circumferential contour 18. The eyeglass lens 12 has a planar edge 21 with a circumferential contour 20. The circumferential contour 18 corresponds to the circumferential contour 20 of the lateral edge 21 of the eyeglass lens 12. That is, the circumferential contour 20 of the lateral edge 21 of the eyeglass lens 12 can be transferred by vertical projection of the eyeglass lens 12 in the direction of the axis 22 into the contour of the edge 18 of the lateral edge surface 16 of the main body 14.

The eyeglass lens 12 shown in FIG. 1 has a circumferential contour 20 that is rotationally symmetrical to the axis 22 of the eyeglass lens 12. The diameter of the circumferential contour 20 of the eyeglass lens is 60 mm here. This is a usual diameter for eyeglass lens blanks and semi-finished eyeglass lenses, from which eyeglass lenses are produced in eyeglass lens production facilities.

The main body 14 is rotationally symmetrical to the axis 22. The diameter $D_G$ of the main body 14 is adapted to the diameter $D_B$ of the eyeglass lens 12. However, in accordance with other usual diameters for the circumferential contour of eyeglass lenses that are machined in eyeglass lens production facilities, the diameter $D_G$ of the main body 14 can also be 55 mm, 60 mm, 65 mm, 70 mm, 75 mm or 80 mm. It is possible in principle to form the main body 14 with any desired diameter or to design it with a circumferential contour 20 that corresponds to an elliptic contour or other contour of an eyeglass lens that is to be machined in a production facility for eyeglass lenses.

The eyeglass lens 12 is attached to the main body 14 by a connecting member 24. The connecting member is an adhesive tape 24. The adhesive tape 24 has a portion 26 which bears with a force fit on the edge 21 of the eyeglass lens 12. The surface of the lateral edge 21 of the eyeglass lens 12 is in this case completely covered with the adhesive tape 24. In this way, the main body 14 and the adhesive tape 24 form a protective cover 15, which surrounds the eyeglass lens 12 on the edge 21 and the surface 30 directed toward the main body 14. With the surface 30 facing toward the main body 14, and with the adhesive tape 24 and the main body 14, the eyeglass lens 12 defines a closed-off hollow space 32 in the carrier device 10. Therefore, in the carrier device 10, the lateral edge surface 18 and the surface 30 of the eyeglass lens 12 are protected against contamination by substances to which the surface 34 of the eyeglass lens 12 is exposed in production and finishing processes in a production facility for eyeglass lenses. The main body 14 has an attachment member 36 designed as a seat for the engagement of a coupling member, which has a centering mandrel, on a rotating spindle of a machining and/or conditioning system. This has the effect that the carrier device 10 can be automatically centered on the rotating spindle. A rotation movement of the rotating spindle can be transferred to the main body 14 via the attachment member 36.

The protective cover 15 is desirable; however, it is not absolutely necessary. Thus, the covering of the lateral edge surface 21 of the lens can be covered but it need not be.

The attachment member 36 ensures that the carrier device 10, with an eyeglass lens received therein, is not automatically thrown off by the effect of the centrifugal force during rapid rotation on the spindle.

Figure 2:
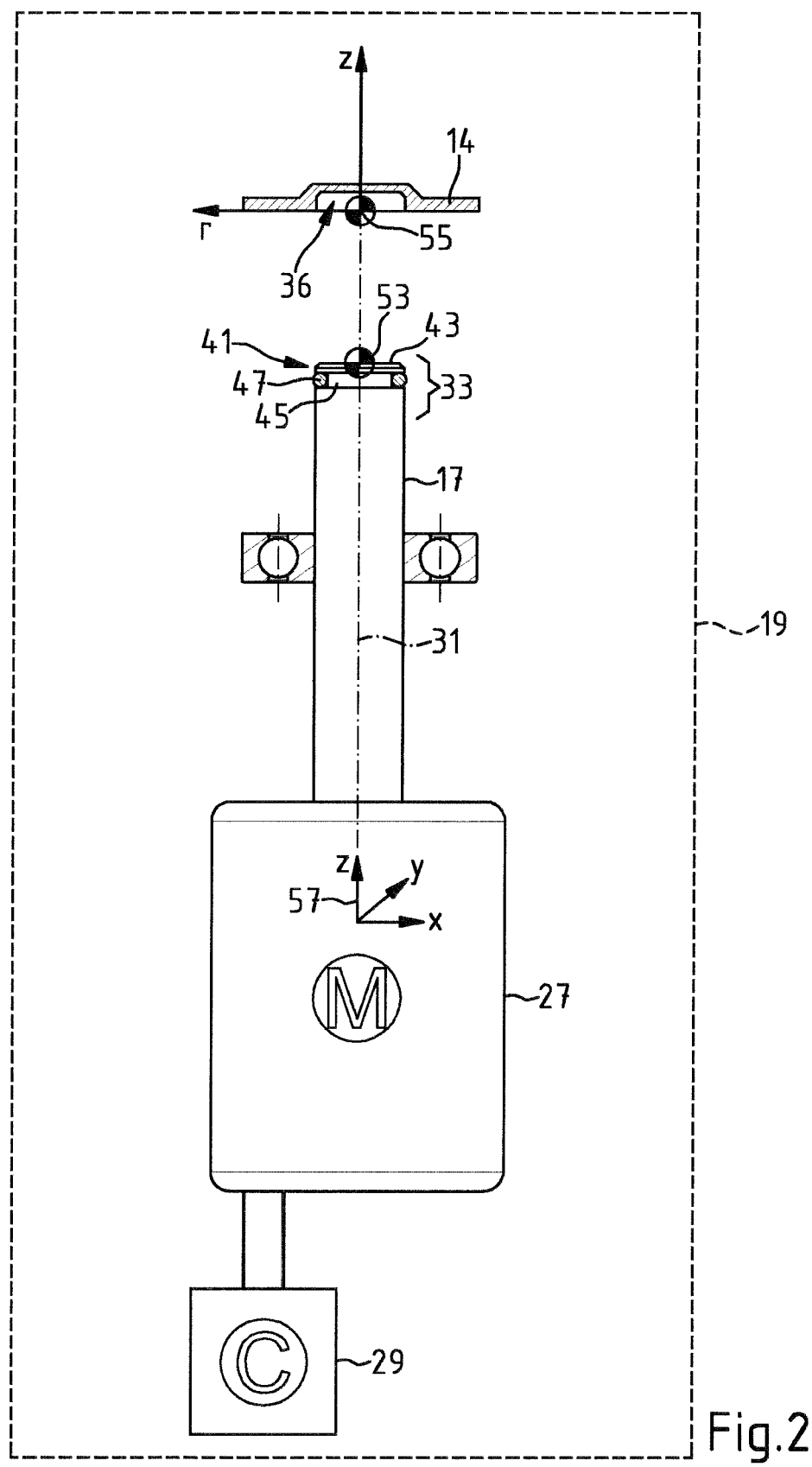
FIG. 2 shows a machining and/or conditioning system with a main body.

FIG. 2 shows the main body 14 of the carrier device 10 with a driven spindle in a machining and/or conditioning system 19 for an eyeglass lens. For driving the spindle, the machining and/or conditioning system 19 comprises an electric motor 27, which can be controlled by a control mechanism 29.

With the electric motor 27, the spindle 17 can be rotated about a rotation axis 31. The spindle 17 has a coupling member 41 on a workpiece-side portion 33. The coupling member 41 has a plane front face 43 and is designed with a groove 45 in which is arranged a ring 47 made of an elastomer material. The coupling member 41 forms a machine-side interface with a machine-side positional reference point 53, which lies in the plane front face 43 of the spindle 17, on the rotation axis 31 thereof.

The attachment member 36 of the main body 14 can be brought into engagement with the coupling member 41 of the spindle 17, by means of the main body 14 being plugged onto the workpiece-side portion 33 of the spindle 17. In this way, a coupling connection of the spindle 17 to the main body 14 is created with which a rotation movement of the spindle 17 can be transferred to the main body 14. With the attachment member 36 of the main body 14, a positional reference point 55 fixed on the main body is defined. When the attachment member 36 of the main body is brought into engagement with the coupling member 41 of the spindle 17, the position of the positional reference point 55 fixed on the main body is coordinated unambiguously with the machine-side positional reference point 53. The attachment member 36 thus defines a machine interface of the main body 14 for the machining and/or conditioning system 19. For a carrier system received with the main body 14 on the spindle 17, this means that the radial position and the z-position of an eyeglass lens received by the carrier system can be indicated in a machine-fixed coordinates system 57, if the position of the eyeglass lens in a carrier device relative to the positional reference point 55 fixed on the main body is known.

When the radial position r and the z-position of an eyeglass lens have been measured after arrangement in a carrier device, it is possible, for example, for the eyeglass lens, with the main body of the carrier device, to be received, in a production facility, on corresponding coupling members of machining and/or conditioning stations and to be successively machined in different stations, thus dispensing with the need for time-consuming multiple measurements of the height and radial position of an eyeglass lens.

The carrier device 10 shown in FIG. 1 contains several support members 38. The support members 38 are located in the hollow space 32 between the eyeglass lens 12 and the main body 14. By means of the support members 38, the eyeglass lens 12 is supported against the main body 14. The support members 38 have an annular spring 40, which is secured on the main body 14 by a clamping shoe 44 guided on a pin 42. A clamping force can be applied to the clamping shoe 44 by an Allen screw 46. With the support members 38, the eyeglass lens 12, on the surface 30 directed toward the main body 14, is supported in an area between the edge of the eyeglass lens and the axis 22.

The support members 38 have the effect that an eyeglass lens 12 received in the carrier device 10 is not plastically deformed, or is only very slightly plastically deformed, when it is heated in the range of the so-called glass transition temperature $T_G$. The glass transition temperature $T_G$ of glass material from which eyeglass lenses of plastic are produced is usually of the order of $T_G \approx 110°$ C. If glass material is heated to the range of the glass transition temperature, this then has the consequence that plastic deformation is caused by even very small mechanical loads and by the inherent weight.

The annular spring 40 is designed such that it adapts itself to an eyeglass lens 12 received in the carrier device 10 and bears thereon over a large contact zone. The spring force to which the eyeglass lens 12 is subjected is low. This measure has the effect that the contact pressure, generated by the contact of the surface 30 of the eyeglass lens 12 with a support member 38, is small on that side of the eyeglass lens 12 facing into the hollow space 32. Thus, when an eyeglass lens 12 received in the carrier device 10 is subjected in a finishing process to a thermal cycle up to the glass transition temperature $T_G$ or beyond, this ensures that no impressions caused by a support member 38 are made on the eyeglass lens 12.

It will be noted that the contact of a support member with an eyeglass lens, which is subjected to a thermal cycle or which bears for a long period of time on the eyeglass lens under atmospheric conditions, for example at normal room temperature, can in principle contaminate the eyeglass lens on account of soiling, in particular diffusion processes or chemical reactions on a surface of the eyeglass lens. Such contamination of the eyeglass lens, on a surface of the eyeglass lens, generally has the result that the eyeglass lens surface in question can no longer be finished by vapor deposition or chemical wet-coating. Such an eyeglass lens then constitutes costly reject material, which in some cases also has to be disposed of at some expense.

The material of the annular spring 40 of a support member 38 is therefore chosen such that an eyeglass lens 12 received in a carrier device 10 is not chemically contaminated on the surface 30 when the eyeglass lens 12 is in contact with the annular spring 40 of a support member 38 and is subjected to a thermal cycle. PTFE in particular is a suitable material for an annular ring 40 since it makes it possible to avoid a chemical contamination of eyeglass lenses.

On its side facing into the hollow space 32, the main body 14 has a surface portion 49 with an information carrier 50. The information carrier 50 is an adhesive strip with a data matrix code 51. However, as the information carrier 50 in the hollow space 32 of the carrier device 10, it is also possible, for example, to arrange an adhesive strip with a barcode or also a chip for radio frequency identification (RFID chip). The information carrier 50 contains information concerning the eyeglass lens 12, for example, information concerning the topography of the optically active surfaces (30, 34) of the eyeglass lens 12 and information concerning an intended or existing coating of these surfaces. The information carrier 50 can also contain a serial number with which the eyeglass lens 12 can be clearly identified in a production facility for eyeglass lenses in which several tens of thousands of eyeglass lenses are produced on a daily basis.

The arrangement of the information carrier 50 on that side of the main body 14 facing into the hollow space 32 makes it possible to read this information using a suitable reading device (not shown), for example, with light, through the surface 34 and the glass body of the eyeglass lens 12.

It is advantageous for the information carrier 50 to store information, for example, concerning the radial position r and the z-position of an eyeglass lens in a carrier device after a corresponding measurement has been carried out. This means that the relevant r-position and z-position of an eyeglass lens in a production facility does not have to be recorded in exhaustive measuring operations on different conditioning and/or machining systems. In such systems, it is then possible for the information concerning the r-position and z-position of an eyeglass lens 12 to be read out from the information carrier 50 with a reading device and fed to a control device with which a conditioning or machining step for a surface 34 of the eyeglass lens 12 is controlled.

Figure 3:
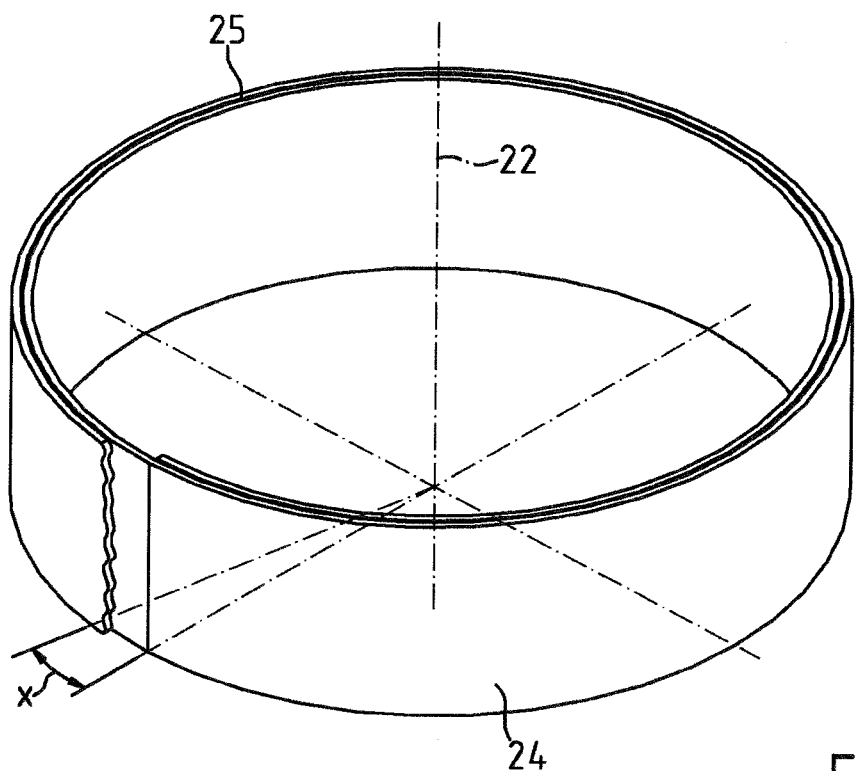
FIG. 3 shows an adhesive tape for connecting main body and eyeglass lens in a carrier device.

FIG. 3 shows the adhesive tape 24 acting as the connecting member between eyeglass lens and main body in the carrier system 10 from FIG. 1. The adhesive tape 24 is preferably an adhesive tape of the type 3M Thermo-Bond Film 845 from the company 3M. This adhesive tape is composed of a thermoplastic which is produced on the basis of modified polyolefin. This adhesive tape has an inwardly facing adhesive layer with a thickness of ca. 0.1 mm and a tape thickness of approximately 0.08 mm. The adhesive tape 24 in the carrier system 10 is also suitably an adhesive tape of the type 6263-54 from the company Sliontec, which is based on a polyurethane film (PET film) coated by means of vapor deposition.

Extensive tests have shown that if, in the carrier device 10 from FIG. 1, the adhesive tape is placed 1.6 times to 1.95 times, preferably, as can be seen in FIG. 3, 1.8 times around the main body and an eyeglass lens, good edge stiffness can be achieved for a packaging system in the form of an eyeglass lens received in a carrier device 10. The edge stiffness can be increased if the length of the adhesive tape 24 is stretched by 3% to 6% during application. With such stretching of the adhesive tape 24, a narrowing is formed between the edge surface 21 of the eyeglass lens 12 and the edge surface 16 of the main body 14.

The narrow side 25 of the adhesive tape 24 is attached tangentially and continuously to the surface 34 of the eyeglass lens 12. The narrow side 25 of the adhesive tape 24 is flush with the edge 35 of the surface 34. Like the surface 34 of the eyeglass lens 12, the height of the narrow side 25 of the adhesive tape 24 drops away to the outside as the distance from the axis 22 increases. In this way, an arrangement is created which is particularly suitable for finishing the surface 34 of the eyeglass lens 12 by means of spin coating. If the eyeglass lens 12 is fixed with the adhesive tape 24 in the carrier device 10 such that, as can be seen in FIG. 1, the vertex 39 of the surface 34 lies on the axis 22 and the tangential face of the surface 34 is horizontal at this point, this means that a lacquer, dropped on in the area of the vertex 39 on the surface 34 of the eyeglass lens 12, is uniformly distributed during rotation of the carrier device 10 with the eyeglass lens 12 about the axis 22.

By contrast, if the cross section of an eyeglass lens 12 received in the carrier device 10 is not rotationally symmetrical, the eyeglass lens 12 is advantageously fixed on a main body 14 in such a way that the edge 20 (shown in FIG. 1) of the eyeglass lens 12 lies at the center in a plane perpendicular to the vertical axis 22.

Figure 4:
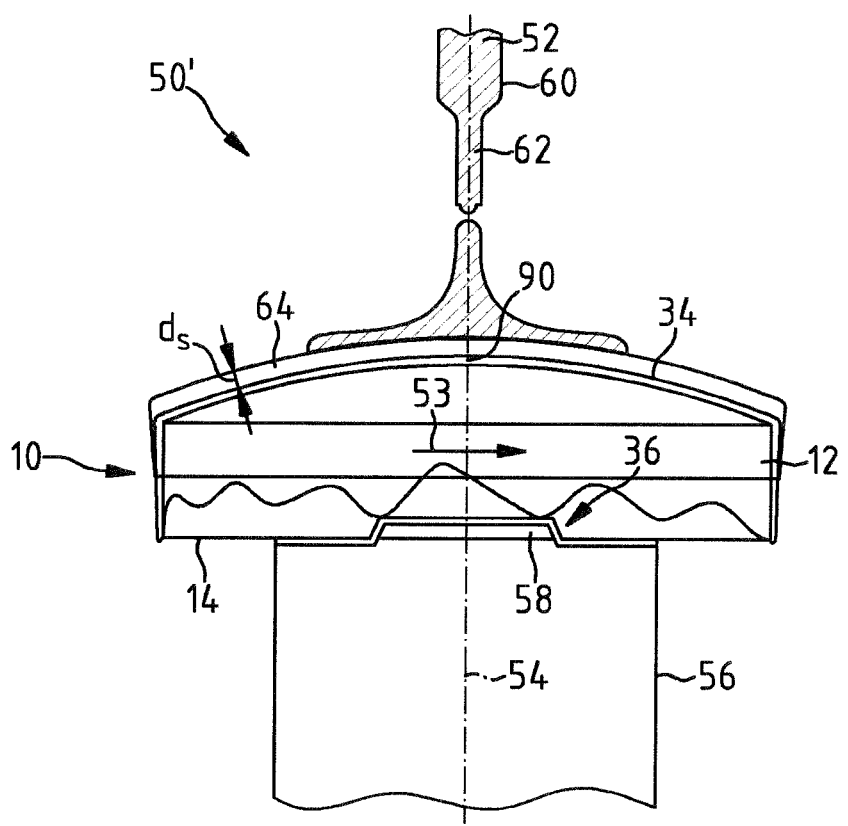
FIG. 4 shows a carrier device in an arrangement for applying lacquer by means of spin coating.

FIG. 4 shows the carrier device 10 with an eyeglass lens 12 in a mechanism 50' for applying a lacquer 52 by means of spin coating. In the mechanism 50', the carrier device 10 is received on a shaft 56 which rotates according to the arrow 53 about the axis 54 and which engages with a centering mandrel 58 in the recess 36 of the main body 14.

On the shaft 56, the carrier device 10 with the eyeglass lens 12 is rotated about the vertex 39 of the surface 34 of the eyeglass lens 12. The lacquer fed from a dosing system 60 through a hollow needle 62 is uniformly distributed on the eyeglass lens 12 on account of the effect of the centrifugal force. For this purpose, the eyeglass lens 12 received in the carrier system 10 is rotated by means of the shaft 56 in such a way that the lacquer 52 dropped from the hollow needle 62 onto the vertex 39 of the surface 34 of the eyeglass lens 12 is carried outward by the centrifugal forces. The speed of rotation of the shaft 56 is set such that a layer 64 with a constant uniform layer thickness $d_s$ of the lacquer 52 forms on the surface 34 of the eyeglass lens 12. For the desired constant uniform layer thickness $d_s$ of the lacquer 52, it is important that the liquid lacquer 52 is driven by the centrifugal forces over the edge of the surface 34 of the eyeglass lens 12.

Below, with reference to FIG. 5A to FIG. 5F, the effect of the speed of rotation of the eyeglass lens on the geometry of a lacquer layer applied to an eyeglass lens 12 by means of spin coating is explained.

Figure 5A:
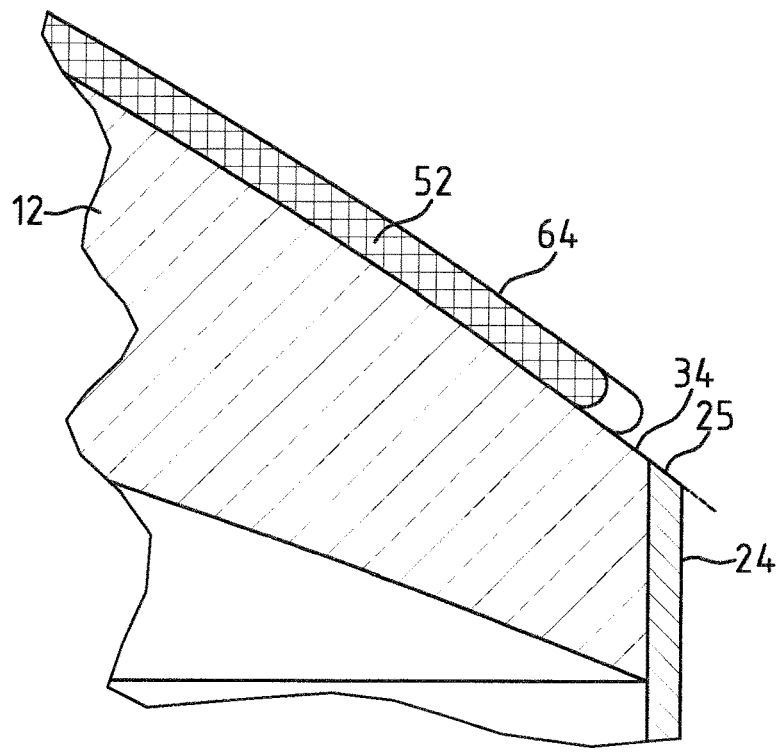
FIGS. 5A to 5F show the application of lacquer, by means of spin coating, to an eyeglass lens received in a carrier device.

FIG. 5A shows a portion of a carrier device 10 with an eyeglass lens 12 on which a layer 64 of lacquer 52 is applied by spin coating at a very low speed of rotation, which lies in a range of between 60 rpm and 100 rpm. On account of this low speed of rotation, the lacquer 52 is not distributed uniformly on the surface 34 of the eyeglass lens 12. This has the consequence that the lacquer 52 only partially covers the surface 34 of the eyeglass lens 12 in the edge zones. The edge of the lacquer layer 64 applied to the eyeglass lens 12 then appears frayed.

Figure 5B:
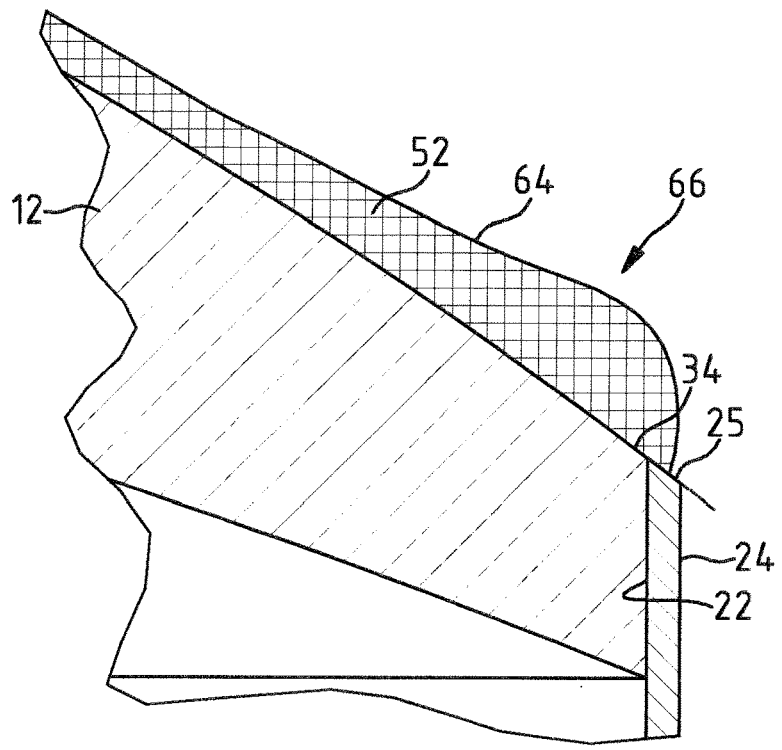

FIG. 5B shows a portion of a carrier device 10 with an eyeglass lens 12 on which the lacquer 52 was applied by means of spin coating at a speed of rotation greater than the speed of rotation corresponding to the situation shown in FIG. 5A. Here, the speed of rotation is high enough to ensure that the entire surface 34 of the eyeglass lens 12 is covered with the lacquer 52. However, in that area of the layer 64 indicated by the arrow 66, the thickness $d_s$ of the layer increases in a wedge shape toward the edge 22 of the eyeglass lens 12. As the lacquer 52 dries, cracks often form in the lacquer layer 64 at the edge 22 of the eyeglass lens 12.

Figure 5C:
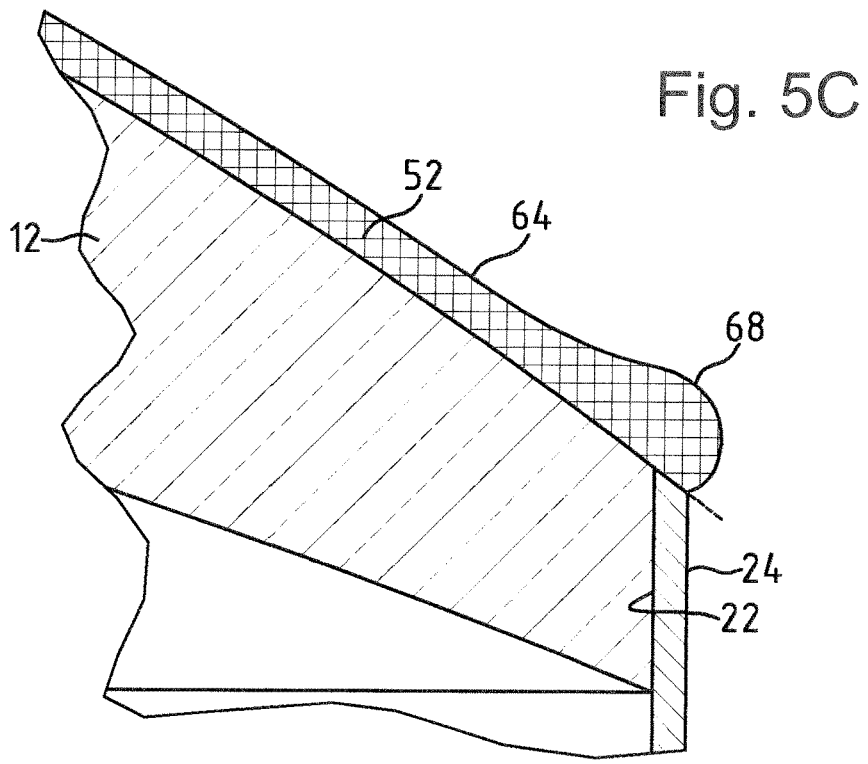

FIG. 5C shows a portion of a carrier device 10 with an eyeglass lens 12 on which the lacquer 52 was applied by means of spin coating at a speed of rotation greater than the speed of rotation for the spin coating in a situation corresponding to FIG. 5A and FIG. 5B. Here, the layer 64 consisting of a lacquer 52 on the surface 34 has a bead 68 at the edge 22 of the eyeglass lens 12. Such a bead 68 in the eyeglass lens 12 has the consequence of limiting the useful surface area, since the bead 68 impairs the optical properties of the eyeglass lens 12 in the edge zones. In production of eyeglass lenses with a positive refractive index, such a bead 68 can lead to undesired reject material, since these eyeglass lenses are usually of a size which does not permit removal of material and which therefore requires that the optically active surfaces are of high quality even in the edge zones.

Figure 5D:
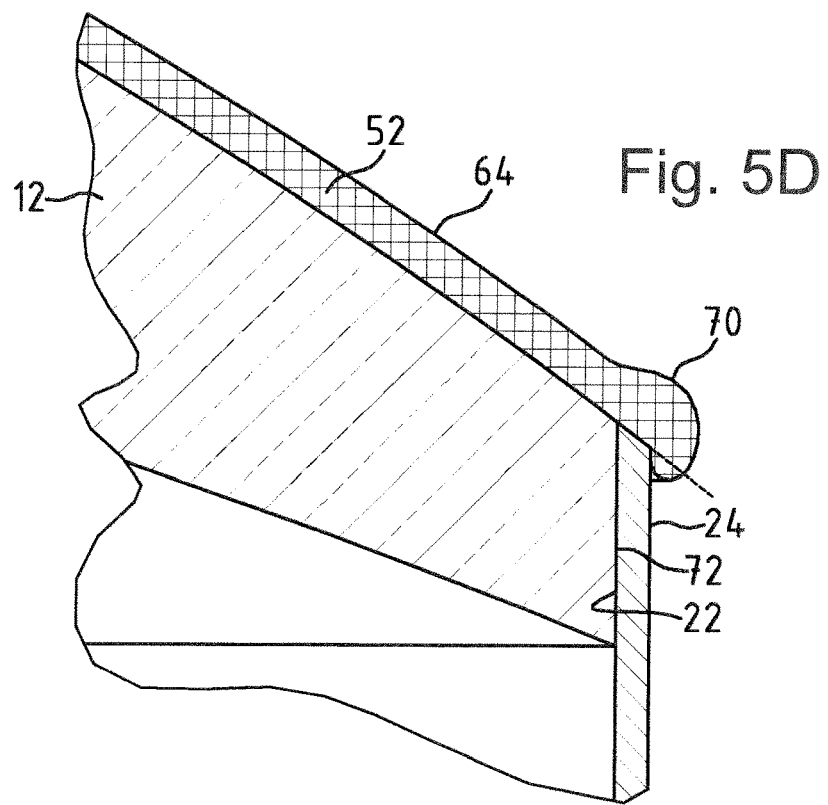

FIG. 5D shows a portion of a carrier device 10 with an eyeglass lens 12 on which the lacquer 52 was applied by means of spin coating at a speed of rotation greater than the speed of rotation for the spin coating in the situation according to FIG. 5C. Here, the layer 64 consisting of a lacquer 52 on the surface 34 of the eyeglass lens 12 has a run 70, which has formed on the edge 22 of the eyeglass lens 12, beyond the rim 72 of the latter. Such a run 70 impairs the quality of the eyeglass lens 12. It has the effect that contamination can occur on the edge 22 of the eyeglass lens 12. The reason for this is that the lacquer there is often not hardened.

Figure 5E:
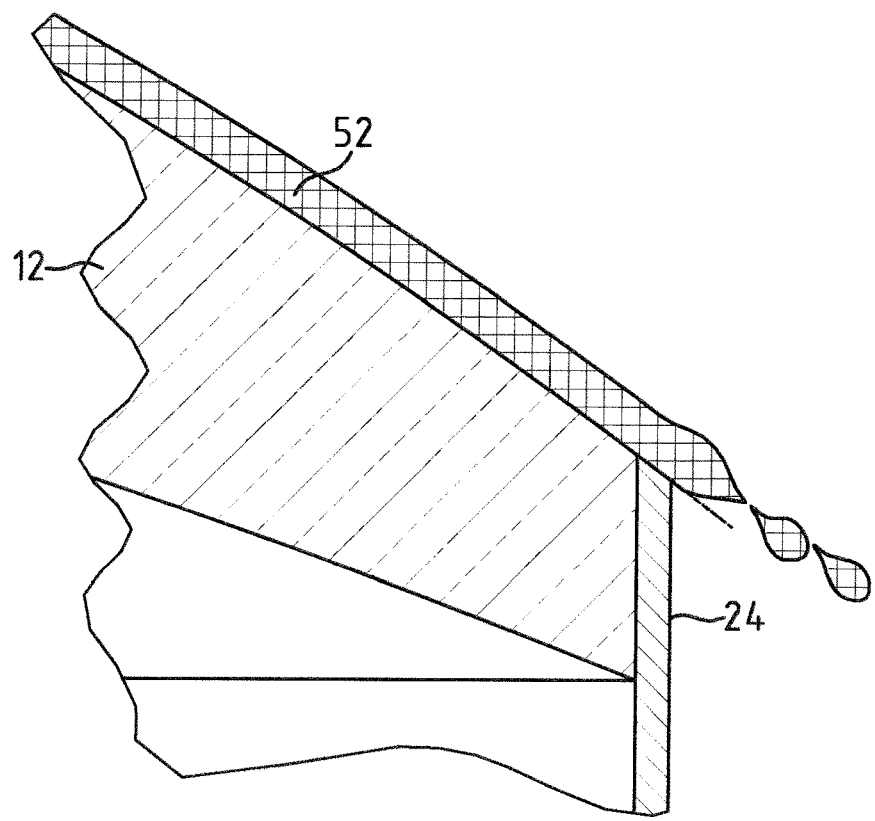

FIG. 5E shows a portion of a carrier device 10 with an eyeglass lens 12 on which the lacquer 52 was applied by means of spin coating at a speed of rotation greater than the speed of rotation for the spin coating in the situation shown in FIG. 5D. Here, the lacquer 52 applied by means of spin coating is thrown off from the eyeglass lens 12 on account of an excessive centrifugal force. This not only results in an undesired loss of lacquer 52 but also has the effect that the packaging systems arranged in an installation for the spin coating of eyeglass lenses for irradiation with UV light become soiled and their functionality is then impaired.

Figure 5F:
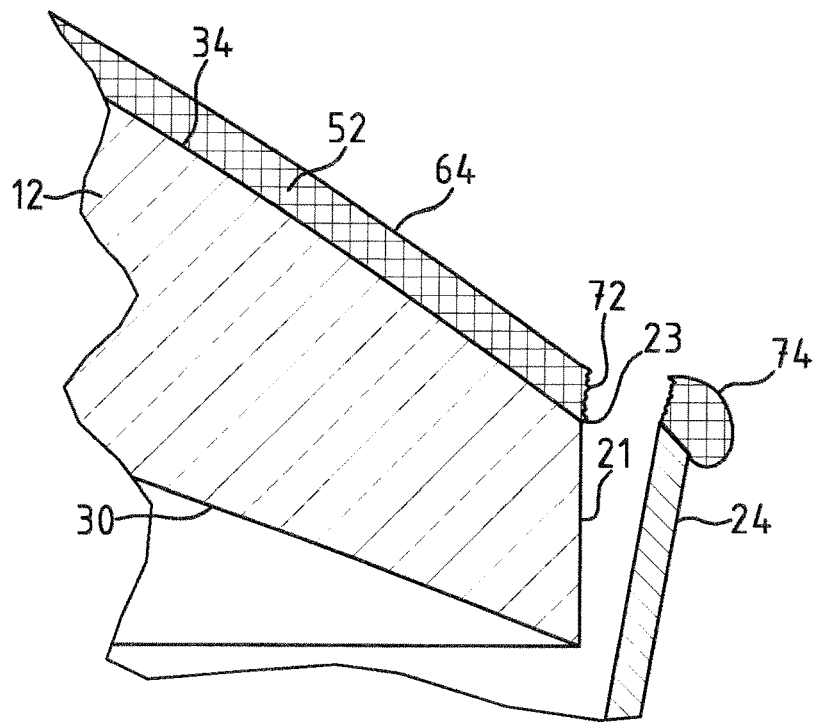

FIG. 5F shows a portion of a carrier device 10 with an eyeglass lens 12 on which lacquer 52 was applied by means of spin coating at a speed of rotation lower than the speed of rotation for the spin coating in the situation according to FIG. 5D. The speed of rotation for the carrier device 10 in an installation for spin coating, as is shown in FIG. 4, is here adapted to the viscosity and the centrifugal behavior of the lacquer 52 in such a way that the lacquer applied to the eyeglass lens 12 from a dosing system in the center of the axis of the rotation movement is driven over the edge 23 of the surface 34 of the eyeglass lens 12 onto the adhesive tape 24, and only here does a lacquer run 74 form. When the adhesive tape 24 is pulled off after completion of a coating operation, which can also include the hardening of applied lacquer 52, a clean rim 72 of the applied lacquer layer 64 forms at the edge 23 of the eyeglass lens 12, without the lacquer 52 coming into contact with the edge surface 21 or with that surface 30 of the eyeglass lens 12 facing into the hollow space.

Since the adhesive tape 24 is thin, that is, has a thickness of the order of only 0.1 mm, which corresponds to a thickness not greater than twice the thickness of a conventional lacquer layer, this means that, when the adhesive tape 24 is pulled off from an eyeglass lens 12, a lacquer layer does not tear at the edge 22 of the latter.

The adhesive tape 24 also prevents the lacquer 52 from reaching the outside of the eyeglass lens and the surface 30 of the eyeglass lens 12 during the spin coating. It is thus possible to ensure that, in a coated eyeglass lens 12, the applied layer has no cracks in the edge zones, and no optical distortions occur here. Moreover, it is possible in this way to ensure that the edge zones of the eyeglass lens blank are not poorly coated.

FIG. 6 shows an installation 80 for equipping a carrier device 10 with an eyeglass lens 12. The installation 80 has a station 82 in which the eyeglass lens 12 is positioned, with a suction cup 84 on the arm of a manipulator 86, over a main body 14. In the station 82, the eyeglass lens 12 is connected to the main body 14 by an adhesive tape 24, which is delivered via a manipulator 88. When applied around the eyeglass lens 12 and the main body 14, the adhesive tape 24 is subjected to a tensile stress, which causes a stretching of the adhesive tape 24 and which leads to a narrowed-in contour 99 of the adhesive tape 24 in a carrier device.

The installation 80 contains a cutting mechanism 90, which has a cutting knife 91 that can be moved by a computer-controlled drive 92. With the cutting knife 91, the adhesive tape 24 on a carrier device 10 is cut to size according to the profile, recorded with an optical measuring device 96, of an edge 35 of the surface 34 of the eyeglass lens 12.

For the cutting to size, the cutting knife 91 is placed tangentially onto the surface 34 of the eyeglass lens 12 by means of the drive 92. The cutting edge of the cutting knife 91 is moved in rotation relative to the eyeglass lens 12 about an axis 87 of the manipulator. The cutting edge of the cutting knife 91 lies in a plane that is tangential to the surface 34 of the eyeglass lens 12. In this way, the adhesive tape 24 is cut to size in such a way that the narrow side 25 of the adhesive tape 24 continuously adjoins the surface 34 of the eyeglass lens 12 at a tangent 37 that bears on the surface 24 of the eyeglass lens 12 and is radial to the axis 22. The surface of the lateral edge 21 of the eyeglass lens 12 is then completely covered with the adhesive tape 24. The adhesive tape 24 is exactly flush with the edge 35 of the surface 34 of the eyeglass lens 12. The adhesive tape 24 is thus attached to the eyeglass lens 12 with an outwardly falling oblique edge.

With eyeglass lenses in which the height h of the edge 35 of the surface 34 with respect to the plane 98 of the bottom surface 15' of the main body 14 of the carrier device varies on the circumference of this surface, the installation 80 makes it possible in particular to seal the lateral edge with the adhesive tape 24 in such a way that the lateral edge 21 of the eyeglass lens 12 is completely covered with the adhesive tape 24 and is attached flush to the edge 35 of the surface 34 of the eyeglass lens 12.

Figure 7:
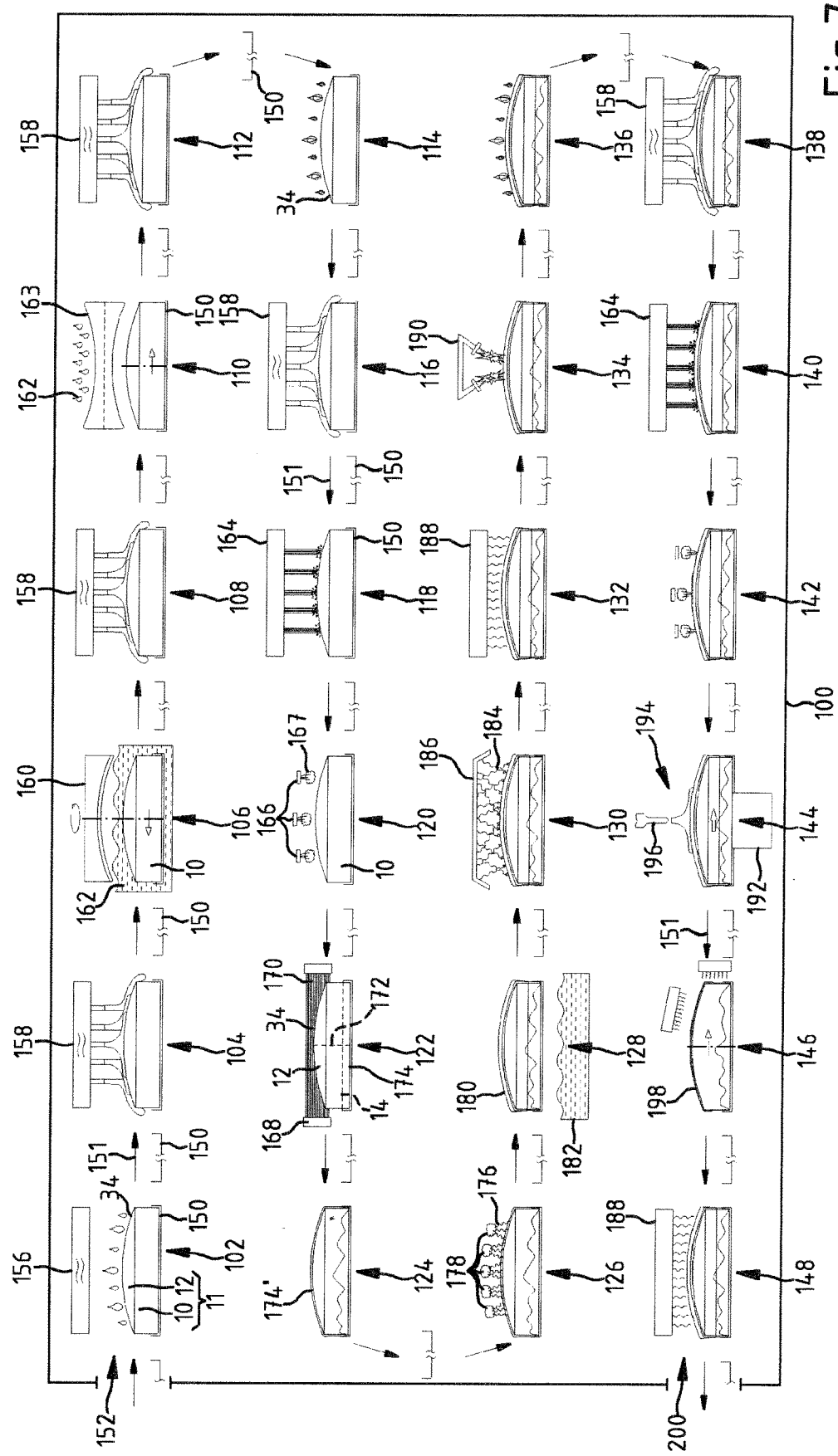
FIG. 7 shows an installation for finishing an eyeglass lens by chemical wet-coating.

FIG. 7 is a schematic view of an installation 100 for the finishing of an eyeglass lens 12 by chemical wet-coating. The installation 100 contains 24 processing stations 102 to 148 through which a packaging system 11 with an eyeglass lens 12, which is received in a carrier device 10, can be moved by a conveying system 150 in the direction indicated by the arrows 151. The packaging system 11 composed of eyeglass lens 12 and carrier device 10 is delivered to the installation 100 through a gate 152. From the gate 152, the conveying system 150 moves the packaging system 11 into a processing station configured as a cleaning station 102. In the cleaning station 102, the substrate of the surface 34 of the eyeglass lens 12 is cleaned with a cleaning medium delivered from a dosing system 156. From here, the packaging system 11 is moved by the conveying system 150 into a processing station 104, in which the eyeglass lens 12 is flushed with warm, fully deionized water which is at a temperature T≈40° C. and which is provided by a flushing device 158. In a processing station configured as a polishing station 106, the surface 34 of an eyeglass lens 12 is then polished by a polishing tool 160 during delivery of cleaning medium 162. Thereafter, the eyeglass lens 12, in a processing station 108, is once again flushed with warm, fully deionized water at a temperature T≈40° C. The conveying system 150 then moves the packaging system 11 into a processing station 110 for mechanical brushing of the surface 34 with a brushing tool 163 in a cleaning medium 162. In the processing station 112, the eyeglass lens 12 received in the carrier device 10 is then once again flushed with water delivered by a flushing device 158. Thereafter, the packaging system 11 is moved into a processing station 114 in which the substrate of the surface 34 of the eyeglass lens 12 is activated with 50%-strength KOH solution. In a processing station 116, the eyeglass lens 12 is then once again flushed, as in the processing station 112, with warm, fully deionized water at a temperature T≈40° C. delivered by a flushing device 158. From the processing station 116, the packaging system 11 with the eyeglass lens 12 is moved by means of the conveying system 150 into a processing station 118 for high-pressure cleaning of the surface 34 of the eyeglass lens 12. For this purpose, the processing station 118 contains a nozzle system 164 with which warm, fully deionized water at a temperature T≈40° C. is delivered at a high pressure P of the order of P=120 bar or more, in order to impact the surface 34 of the eyeglass lens 12. According to the arrow 151, the conveying system 150 in the installation 100 then moves the packaging system 11, composed of an eyeglass lens 12 in the carrier device 10, into a processing station 120 in which the surface 34 of the eyeglass lens 12 is dried with a warm air stream 167 from a nozzle system 166.

After the drying, the eyeglass lens 12 is measured in the processing station 122 by a measuring system 168 with laser light 170. With the measuring system 170, the topography of the enveloping surface area of the eyeglass lens 12, that is, the topography of the surface 34 thereof, is determined, and the z-height function 172 of the eyeglass lens 12 with respect to the bottom surface 174 of the main body 14 of the carrier device 10 is determined. After the measuring procedure in the processing station 122, the eyeglass lens 12 is primed, in the processing station 124, with adhesion promoter 174', which is provided by a dosing system (not shown). In a processing station 126, the adhesion promoter 174' is then dried with a laminar flow 176 which comes from a nozzle system 178 and which is in the form of conditioned air, of which the moisture content and temperature are specifically set. The conveying system 150 then moves a packaging system 11 into a processing station 128, in which a functional lacquer 180 is applied to the surface 34 of the eyeglass lens 12 by immersion in a lacquer bath 182. After the application of the functional lacquer 180, the applied lacquer layer is then hardened with UV light 184 from an irradiating device 186 in a processing station 130. The wavelength λ of the UV light 184 lies in the range of 360 nm≤λ≤420 nm. In a processing station 132, the eyeglass lens 12 is then exposed to ambient air from a circulation system 188, in order to post-harden the corresponding lacquer layer on the eyeglass lens 12 at a temperature T in a range of 90° C.≤T≤130° C.

With the conveying system 150, the packaging system 11 is then moved from the processing station 132 into a processing station 134, in which the surface 34 of the eyeglass lens 12 is subjected to high voltage U of the order of U=40 kV from a high-voltage system 190, in order thereby to activate the functional lacquer that was applied to the eyeglass lens in the processing station 128. In a processing station 136 downstream of the processing station 134, the surface of the eyeglass lens 12 is then activated, as in the processing station 114, with 50%-strength KOH solution, so as to be treated subsequently in the processing stations 138, 140 and 142, which correspond to the processing stations 116, 118 and 120.

The conveying system 150 finally moves the packaging system 11 into a processing station 144 and positions the eyeglass lens 12, received in the carrier device, on a driven spindle 192 of a mechanism 194 for spin coating, under a dosing system 196 for a protective lacquer 198. The protective lacquer 198 applied by means of spin coating in the processing station 144 is then hardened with IR light, in a processing station 146, at a temperature T lying in the range of 50° C.≤T≤80° C. In a processing station 148, whose set-up corresponds to that of the processing station 132, the protective lacquer 198 is post-hardened again with ambient air at a temperature T in a range of 90° C.≤T≤130° C.

With the conveying system 150, the eyeglass lens 12 finished in the installation 100 is released with the carrier device 10 through a gate 200 to a buffer installation (not shown), from which the corresponding eyeglass lenses with carrier devices can then be removed in order to undergo further machining steps.

The method for finishing an eyeglass lens with a packaging system which includes a carrier device and the eyeglass lens accommodated thereon is described above in detail. The eyeglass lens has first and second lens surfaces and a lateral peripheral edge delimiting the first and second lens surfaces and defining an edge surface extending between the first and second lens surfaces.

In the above, it is noted that the carrier device for carrying out the method of the invention includes the main body and a singular annular connecting member directly contact engaging both the main body and the lens and being configured to releasably connect the main body to the lens. The lens is accommodated in the carrier device so as to cause the first lens surface to face toward the main body and the second lens surface to face away from the main body. The main body and the connecting member conjointly define a protective cover surrounding the first lens surface thereof facing toward the main body. Preferably, the connecting member is in contact engagement with all of the edge surface when the lens is held in the carrier device so as to protect the edge surface from damage during the handling of the lens. The connecting member is one of: an adhesive tape placed around the lateral edge of the lens and a clamping ring engaging around the lateral edge of the lens.

With the packaging system conjointly defined by the eyeglass lens and the carrier device, an embodiment of the method includes the step of moving the packaging system to a processing station configured as a coating station and coating the second lens surface in the coating station. The coating can, for example, be a hard lacquer coating.

The method of the invention can include the further step of moving the packaging system to a processing station and there activating or conditioning the second lens surface in order to increase adhesion prior to coating the second lens surface.

A further feature of the method of the invention includes the step of moving the packaging system to a processing station and there activating or conditioning the second lens surface in order to increase adhesion prior to coating the second lens surface.

A further method step is moving the packaging system to a processing station and there providing an anti-reflection coating.

A further method step includes moving the packaging system to a processing station and there providing an anti-reflection layer on the coating.

According to another feature of the invention, the anti-reflection layer is produced by chemical wet-coating or by physical vapor deposition.

Figure 8A:
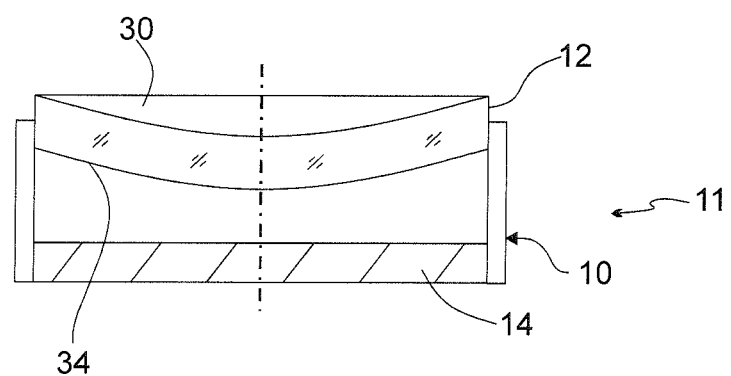
FIG. 8A shows a packaging system wherein the eyeglass lens is accommodated on the carrier device to facilitate processing the back side surface of the eyeglass lens.

FIG. 8 is a partial section of a coated eyeglass lens 12 in a carrier device 10 according to the invention. A layer 204 of a so-called primer, which acts as adhesive layer, is situated on the surface 34 of the eyeglass lens 12. A layer 206 of a photochromic material is situated on the layer 204. The layer 206 is covered by a layer 208 of hard lacquer, on which an anti-reflection layer 210 is situated. A hydrophobic layer 212 is situated on the anti-reflection layer 210. An anti-fogging layer 214 is situated on the hydrophobic layer 212. The layers 204 to 213 on the surface 34 of the eyeglass lens are produced by means of chemical wet-coating, which can be carried out, as in the installation described above with reference to FIG. 7, on an eyeglass lens 12 received in a carrier device 10. The surface 30 of the eyeglass lens 12 facing into the hollow space 32 in the carrier device 10 is covered with a layer 216 of a primer which, like the layer 204, acts as an adhesive layer. A layer 218 of hard lacquer is applied to the layer 216. The layer 218 is covered with an anti-reflection layer 220, on which a hydrophobic layer 222 and an anti-fogging layer 224 are situated. With the carrier device 10, it is possible to finish the surface 34 of the eyeglass lens 12 by chemical wet-coating when the surface 30 of the eyeglass lens 12 has already been fully coated. The carrier device 10 allows an eyeglass lens 12 to be received in such a way that the lateral edge surface 26 of an eyeglass lens 12 and the side 30 of the eyeglass lens facing into the hollow space 32 of the carrier device 10 are protected against contamination in conditioning and machining processes carried out on the surface 34 of the eyeglass lens 12.

The carrier system 10 is also suitable for coating the back side surface 30 of the eyeglass lens 12 shown in FIG. 1. For this purpose, the lens 12 is accommodated on the carrier device as shown schematically in FIG. 8A with surface 34 protected and facing toward the main body A. The packaging system 11 comprising the carrier device 10 and the lens 12 is again moved through the processing stations 102 to 148 to chemically wet-coat the remaining back side surface 30 of the eyeglass lens 12. The chemically wet-coated surface 34 remains protected as described above.

Accordingly, the method of the invention can further include the steps of: removing the adhesive tape or clamping ring and then inverting the eyeglass lens so as to cause the second surface thereof to face toward the main body and the first surface thereof to face away from the main body; reapplying the adhesive tape or clamping ring to secure the eyeglass lens in place on the main body; and, moving the packaging system to a processing station configured as a coating station and coating the first surface. Here, the coating can be a hard lacquer coating.

A further method step provides for moving the packaging system to a processing station and there activating or conditioning the first surface in order to increase adhesion.

A further step of the method of the invention provides for moving the packaging system to a processing station and there activating or conditioning the first surface in order to increase adhesion.

A further feature of the invention includes the step of moving the packaging system to a processing station and there providing an anti-reflection coating.

The step of moving the packaging system to a processing station and there providing an anti-reflection layer on the coating is still another feature of the method of the invention.

The anti-reflection layer is produced, for example, by chemical wet-coating or by physical vapor deposition.

Figure 8B:
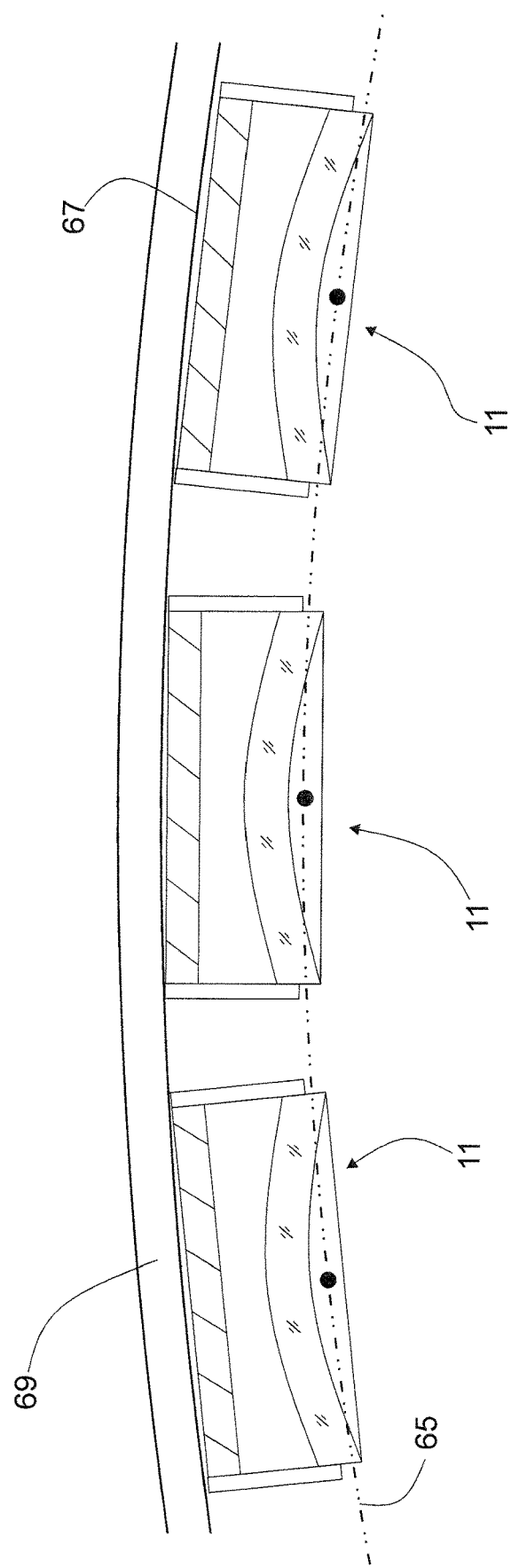
FIG. 8B shows a plurality of packaging systems of FIG. 8A mounted on a calotte which forms part of the vapor deposition system.

A plurality of packaging systems each comprising the carrier system and the eyeglass lens can be mounted on the calotte 69 of a vapor deposition system as shown in FIG. 8B. The packaging systems 11 are attached to the calotte 69 via a clip system or magnets arranged at interface 67. The packaging systems are mounted on the calotte so as to cause the surface centroids of the eyeglass lenses to lie in theoretical spherical surface 65 during the vapor deposition process.

A method for coating an eyeglass lens utilizes a processing system of the kind described above which includes a vapor deposition system for vapor depositing a coating on the eyeglass lens and a packaging system which includes a carrier device and the eyeglass lens accommodated thereon. The eyeglass lens has first and second lens surfaces and a lateral peripheral edge delimiting the first and second lens surfaces and defining an edge surface extending between the first and second lens surfaces and each of the first and second lens surfaces defining a surface centroid.

The carrier device includes: a main body; and, a singular annular connecting member directly contact engaging both the main body and the lens and is configured to releasably connect the main body to the lens. The lens is accommodated in the carrier device so as to cause the first lens surface to face toward the main body and the second lens surface to face away from the main body. The main body and the connecting member conjointly define a protective cover surrounding the first lens surface thereof facing toward the main body. Preferably, the connecting member is in contact engagement with all of the edge surface when the lens is held in the carrier device so as to protect the edge surface from damage during the handling of the lens. The connecting member is one of: an adhesive tape placed around the lateral edge of the lens and a clamping ring engaging around the lateral edge of the lens.

The vapor deposition system includes a calotte having an inner surface and a vapor deposition device for directing vaporized coating material to the second lens surface.

This embodiment for coating an eyeglass lens then includes the steps:

attaching a plurality of the packaging systems to the inner surface of the calotte so as to cause the second lens surface to face toward the vapor deposition device;

adjusting the packing systems so as to cause the centroid of corresponding ones of the second lens surfaces to lie in an imaginary spherical surface concentric with the inner surface of the calotte; and, simultaneously vapor depositing the coating material onto the second lens surfaces of corresponding ones of the eyeglass lenses.

Figure 9:
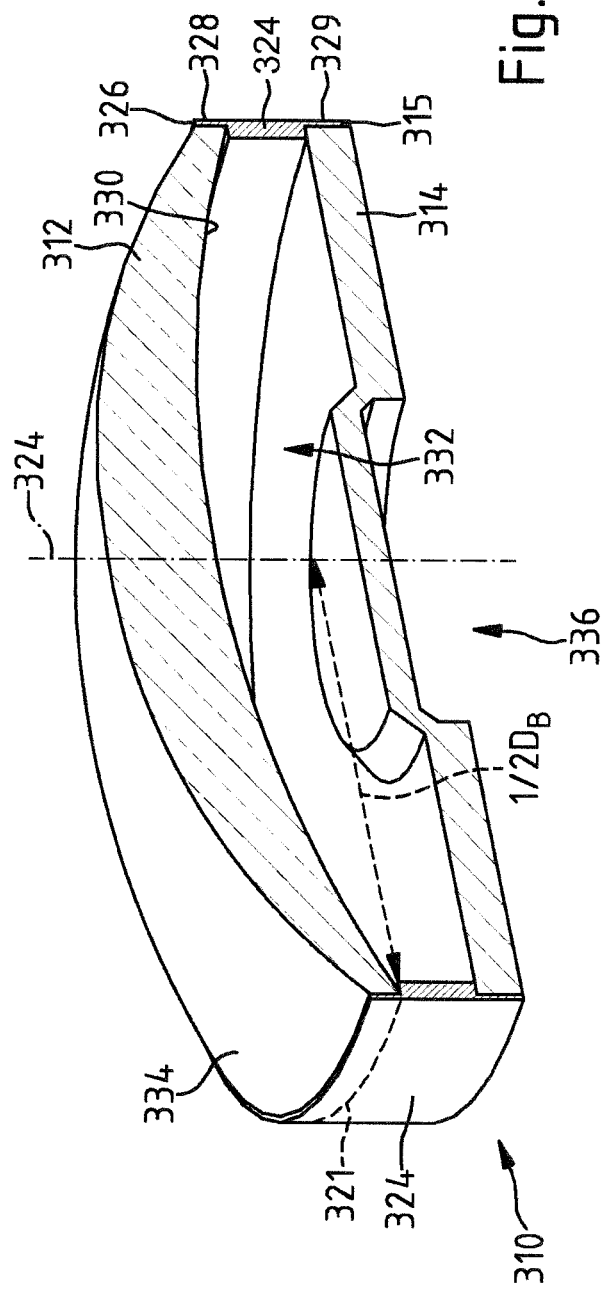
FIG. 9 shows a carrier device with a clamping ring for securing an eyeglass lens on a main body.

FIG. 9 shows a carrier device 310 with a clamping ring 324 for securing an eyeglass lens 312 on a main body 314. Insofar as the structure of the carrier device 310 corresponds to the structure of the carrier device 10 described with reference to FIG. 1 to FIG. 3, the components of the carrier device 310 are provided with reference signs increased by 300 in relation to FIG. 1, FIG. 2 and FIG. 3. Unlike the eyeglass lens 12 received in the carrier device 10 of FIG. 1, the eyeglass lens 312 in the carrier device 310 is an eyeglass lens with a positive refractive index.

The clamping ring 324 is a connecting member with which the eyeglass lens 312 is attached to the main body 314 of the carrier device 310. The clamping ring 324 is composed of an elastic polymer, for example, of thermoplastic elastomer or of PTFE.

The clamping ring 324 is formed with a T-shaped cross-sectional profile and has a portion 328 which bears with a force fit on a lateral edge surface 326 of the eyeglass lens 312. The clamping ring 324 has a portion 329 that surrounds the lateral edge 315 of the main body 314. The lateral edge 321 of the eyeglass lens 312 is then completely covered by the clamping ring 324.

The clamping ring 324 has a front end face 326 which continuously adjoins the surface 334, directed away from the main body 314, of an eyeglass lens 312 received in the carrier device 310. The eyeglass lens 312 received in the carrier device 310 forms a closed-off hollow space 332 with the surface 330 facing the main body 314 and with the clamping ring 324 and the main body 314.

In the carrier device 310, the lateral edge surface 326 and the surface 330 of the eyeglass lens 312 are thus protected against contamination by substances to which the surface 334 of the eyeglass lens 312 is exposed in production and finishing processes in a production facility for eyeglass lenses.

Figure 10:
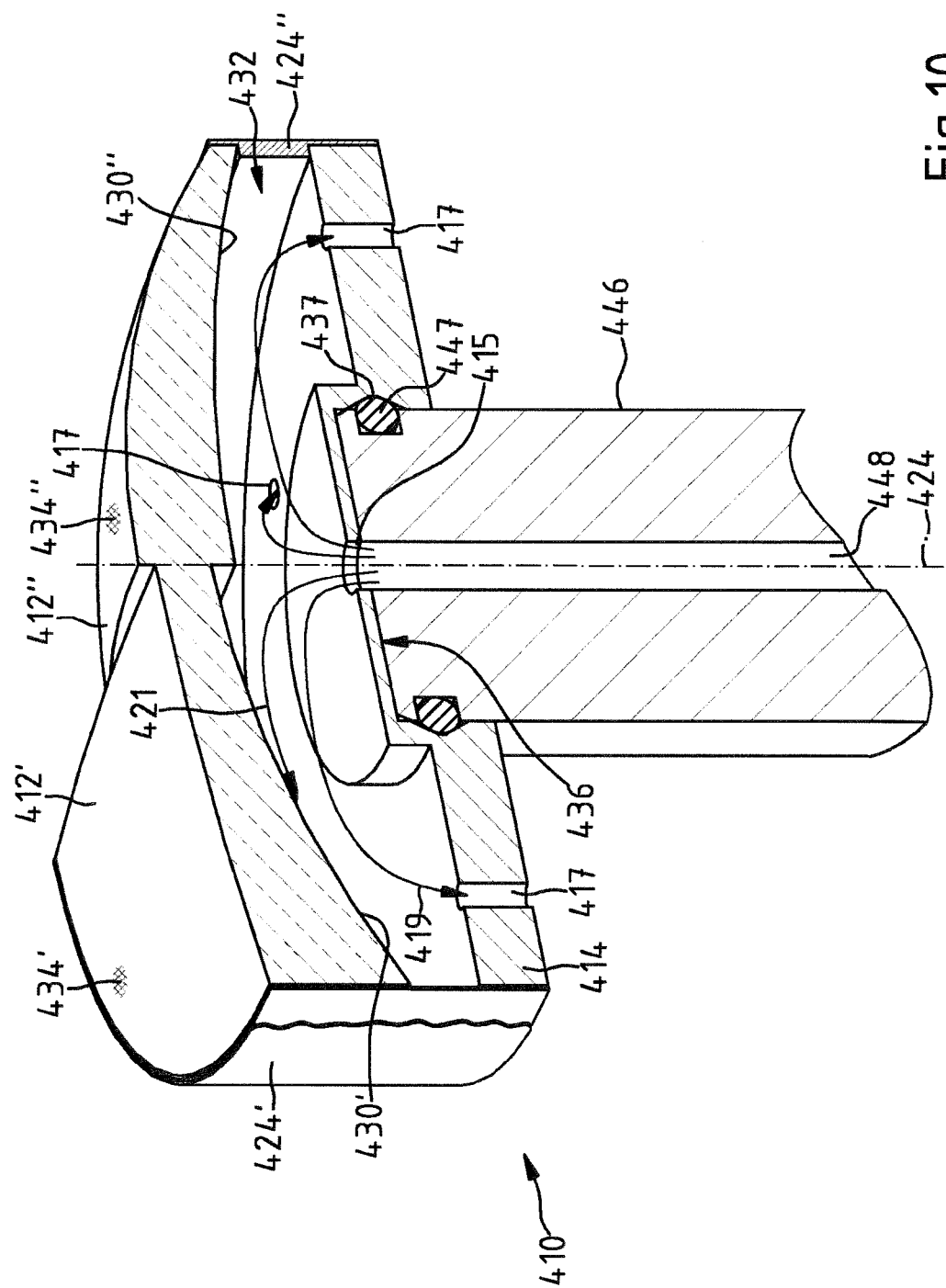
FIG. 10 shows a carrier device with a cooling mechanism for an eyeglass lens.

FIG. 10 shows a carrier device 410 in which an eyeglass lens, which is received in the carrier device 410 and can be designed as a minus-power lens 412' or as a plus-power lens 412", can be cooled with a stream of fluid guided through the hollow space 432, while the surface (434', 434") is finished, for example, by hardening of a chemical wet coating. Insofar as the structure of the carrier device 410 corresponds to the structure of the carrier device 10 described with reference to FIG. 1 to FIG. 3, the components of the carrier device 410 are provided with reference signs increased by 400 in relation to FIG. 1, FIG. 2 and FIG. 3. The carrier device 410 likewise comprises a connecting member (424', 424") which connects a main body 414 to the eyeglass lens 412 and which can be designed as a plastic adhesive tape 424' or a clamping ring 424".

The main body 414 of the carrier device 410 has a seat 436 acting as an interface for a rotatable shaft 446 with a fluid channel 448. The rotatable shaft 446 forms a receiving unit in a processing station of an eyeglass lens production facility (not shown).

The seat has a groove 437 for the engagement of a sealing ring 447 arranged on a shaft 446. In the main body 414, an opening 415 is formed via which a fluid channel 448 formed in the shaft 446 can be connected to the interior of the hollow space 432 of the carrier device. The main body 414 is also provided with openings 417 set back radially from the axis 424.

When a gaseous or liquid fluid, which is under pressure, is applied to the fluid channel 448 of the rotatable shaft 446, a flow corresponding to the arrows (419, 421) can be established in the hollow space 432, making it possible, for example, to transport heat away from the surface (430', 430") of the eyeglass lens 412 facing into the interior of the hollow space 432. It will be noted that it is in principle also possible for a gaseous fluid, for example, air, to be sucked through the openings 417 in the main body 414 and through the fluid channel 448 formed in the shaft 446, in order to cool an eyeglass lens (412', 412") received in the carrier device 410.

Figure 11:
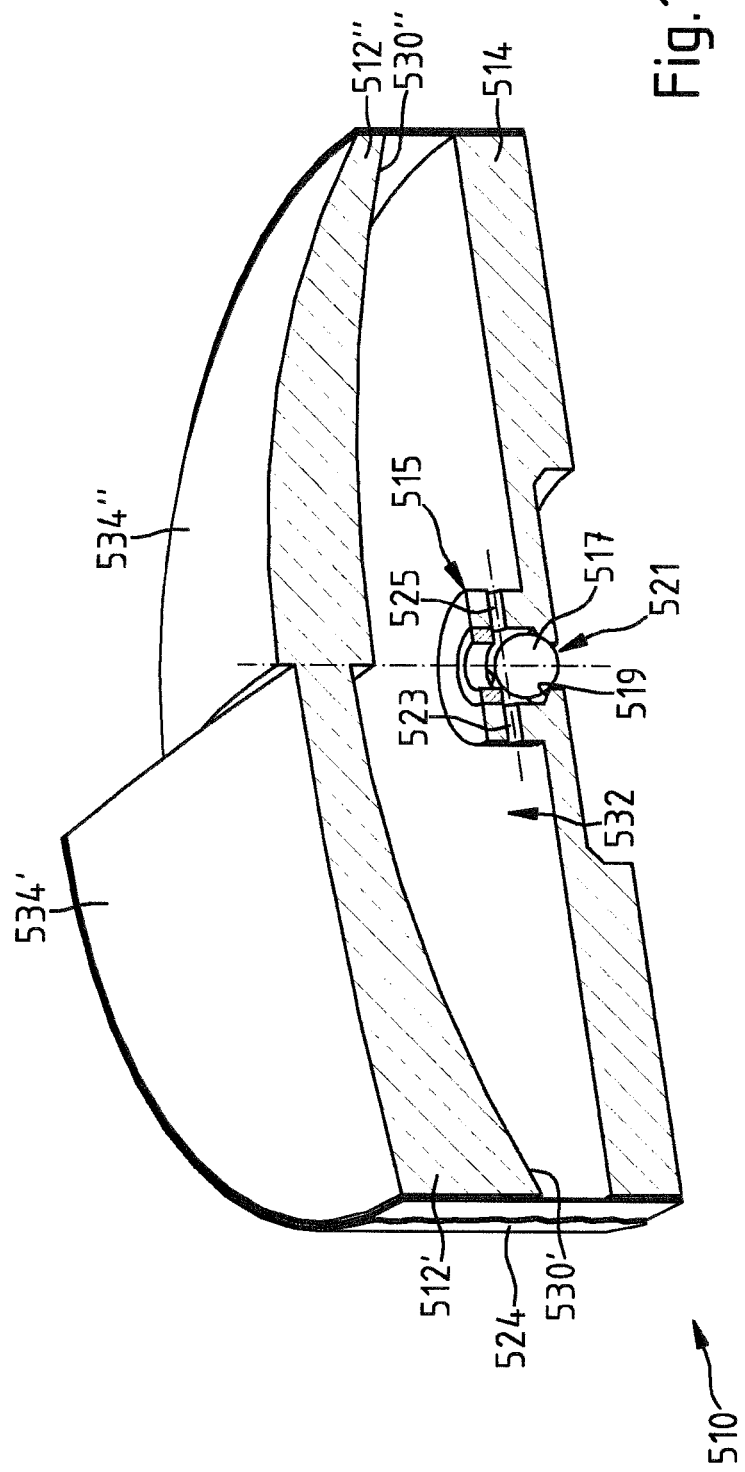
FIGS. 11 to 17 show further carrier devices with an eyeglass lens.

FIG. 11 shows a carrier device 510 with a main body 514 that has an interface with a self-closing overpressure valve 515, by which the hollow space 532 in the carrier device 510 can be exposed, in a filling station with an attachment element protruding into the seat 536, to a liquid or gaseous fluid medium that is under pressure. In the carrier device 510, the hollow space 532 acts as a fluid volume subjected to overpressure.

Insofar as the structure of the carrier device 510 corresponds to the structure of the carrier device 10 described with reference to FIG. 1 to FIG. 3, the components of the carrier device 510 are provided with reference signs increased by 500 in relation to FIG. 1, FIG. 2 and FIG. 3.

The overpressure valve 515 is designed as a ball valve with a valve ball 517, which can be moved in a valve space 519. An overpressure present in the hollow space 532 presses the valve ball 517 into a valve seat 519. By contrast, if the opening 521 of the main body 514 is exposed to a pressure that is greater than the pressure in the hollow space 532, the valve ball 517 is lifted from its valve seat 519, which has the effect that fluid medium can then pass through the opening 521, and through fluid channels (523, 525) formed in the overpressure valve, into the interior of the hollow space 532.

When a fluid medium that is under pressure is applied to the hollow space 532, a support member is created with which the eyeglass lens (512', 512") in the carrier device 510 is supported, via the surface (530', 530") facing into the hollow space 532, with a supporting force that stabilizes the eyeglass lens (512', 512") when it is thermally loaded, for example in a thermal cycle, or when a lacquer layer applied by chemical wet-coating is hardened by irradiation with UV light.

Figure 12:
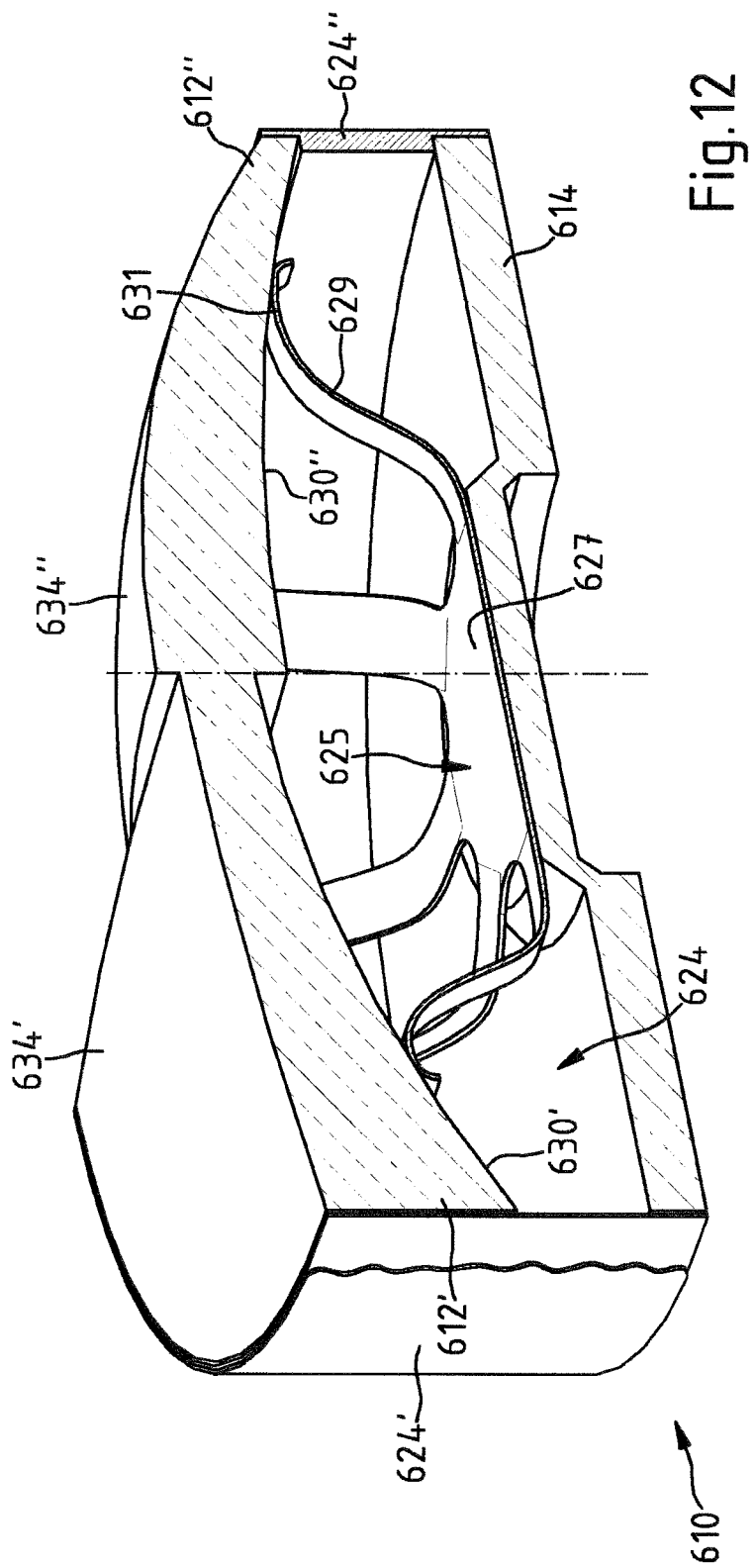

FIG. 12 shows a carrier device 610 for an eyeglass lens that can be designed as a minus-power lens 612' or as a plus-power lens 612". Insofar as the structure of the carrier device 610 corresponds to the structure of the carrier device 10 described with reference to FIG. 1 to FIG. 3, the components of the carrier device 610 are provided with reference signs increased by 600 in relation to FIG. 1, FIG. 2 and FIG. 3. The carrier device 610 likewise comprises a connecting member which connects a main body 614 to the eyeglass lens (612', 612") and which can be designed as a plastic adhesive tape 624' or a clamping ring 624". In the hollow space 624, there is a support member 625 in the form of a spring with a spring body made of PTFE. The spring 625 has a flat portion 627 which bears on a surface 649 of the main body 614 facing into the hollow space 632 and on which several spring tongues 629 are formed that extend like spiders' legs into the hollow space and support the eyeglass lens (612', 612") via a convexly curved portion 631 bearing on the surface (630, 630").

As with the support members 38 of the carrier device 10 in FIG. 1, the support member 625 can ensure that an eyeglass lens (612', 612") received on the carrier device 610 does not undergo plastic deformation, or at any rate undergoes only very little plastic deformation, when it is heated to the range of the so-called glass transition temperature $T_G$.

Figure 13:
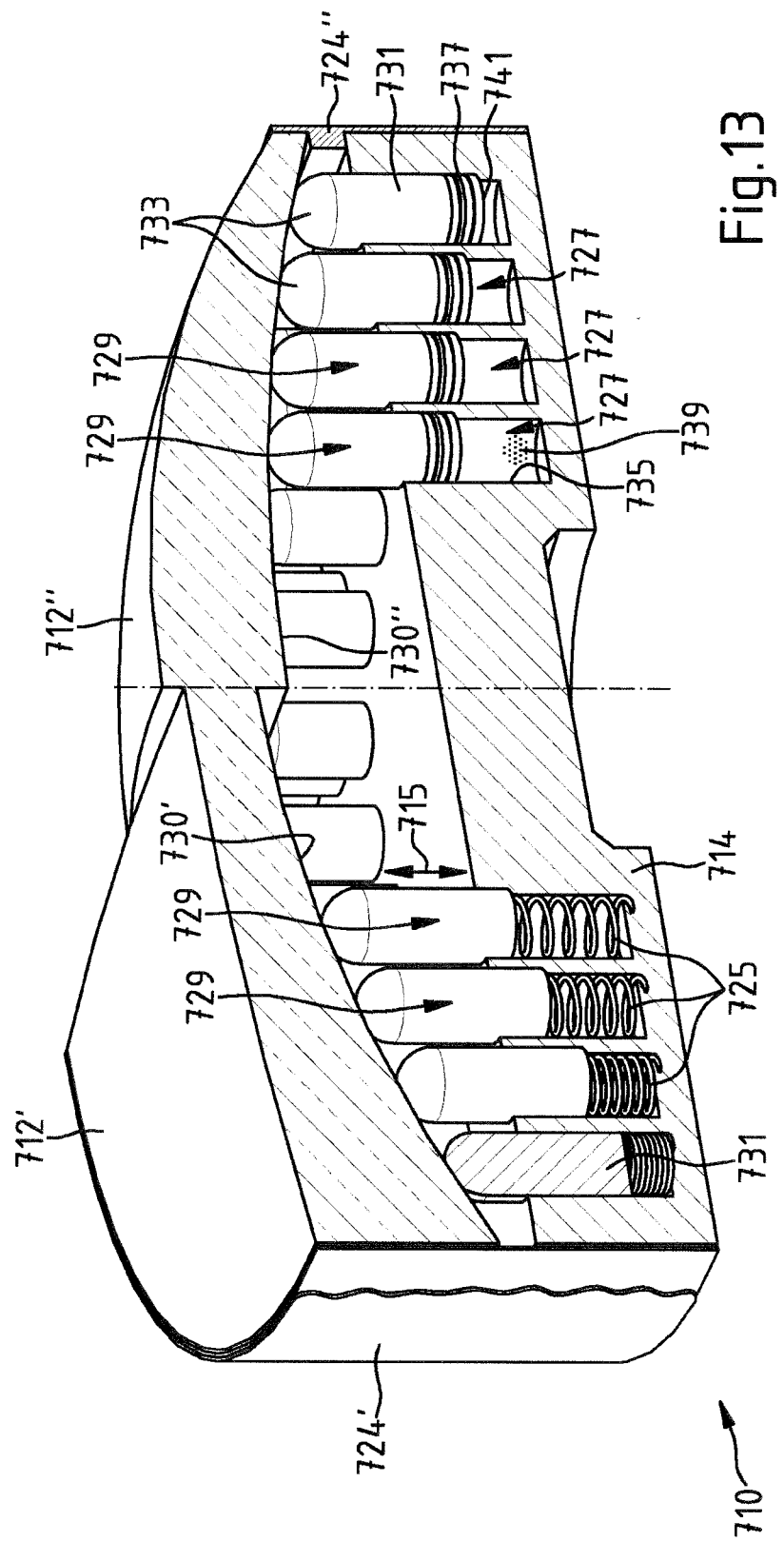

FIG. 13 shows another carrier device 710 for an eyeglass lens that can be designed as a minus-power lens 712' or as a plus-power lens 712". Insofar as the structure of the carrier device 710 corresponds to the structure of the carrier device 10 described with reference to FIG. 1 to FIG. 3, the components of the carrier device 710 are provided with reference signs increased by 700 in relation to FIG. 1, FIG. 2 and FIG. 3. The carrier device 710 likewise comprises a connecting member for connecting a main body 714 to the eyeglass lens (712', 712"). The connecting member can be designed as a plastic adhesive tape 724' or a clamping ring 724". In the hollow space 724, there are a large number of support bodies 729 which are designed in the manner of a ram, are subject to the force of a mechanical spring mechanism 725 or of a pneumatic spring mechanism 727 and have a Teflon-coated cylindrical circumferential surface 731 with a rounded dome 733. The mechanical spring mechanism 725 contains a helical spring. The pneumatic spring mechanism 727 has a piston 735, which is received in a cylindrical bore 733, with a sealing ring 737 which cooperates with a gas cushion 739. It is possible to design the carrier device 710, not as a mechanical or pneumatic spring mechanism, but instead also in particular as a hydraulic spring mechanism.

The support bodies 729 are guided linearly in the main body 714. They can be moved relative to the main body 714 in a direction corresponding to the double arrow 715. With the mechanical or pneumatic spring mechanism (725, 727), the support bodies 729 act as a support member with which the eyeglass lens (712', 712"), on its surface (730', 730") facing the main body 714, is supported on the main body 714.

As with the support members 38 in the carrier device 10 in FIG. 1, it is thus possible to ensure that an eyeglass lens (712', 712") received in the carrier device 710 does not undergo plastic deformation, or at any rate undergoes only very little plastic deformation, when it is heated to the range of the so-called glass transition temperature $T_G$.

Figure 14:
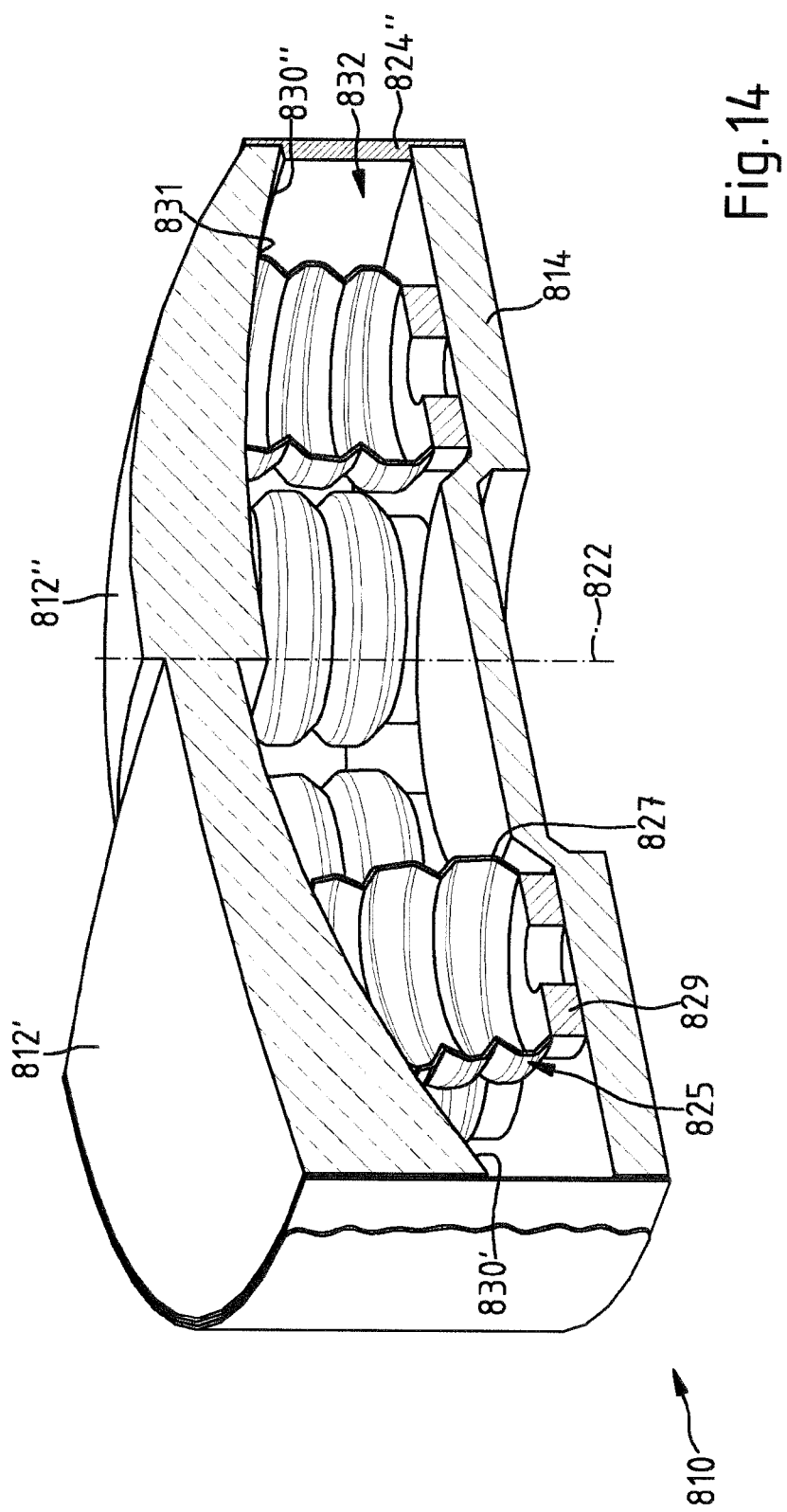

FIG. 14 shows a carrier device 810 for an eyeglass lens that can be designed as a minus-power lens 812' or as a plus-power lens 812". Insofar as the structure of the carrier device 810 corresponds to the structure of the carrier device 10 described with reference to FIG. 1 to FIG. 3, the components of the carrier device 810 are provided with reference signs increased by 800 in relation to FIG. 1, FIG. 2 and FIG. 3. The carrier device 810 likewise comprises a connecting member for connecting a main body 814 to the eyeglass lens (812', 812"). The connecting member can be designed as a plastic adhesive tape 824' or a clamping ring 824". In the hollow space 832, there are a large number of hollow bodies 825 which are made of plastic, preferably Teflon, and which have a wall 827 designed as a bellows. The hollow bodies 825 have an attachment portion 829, with which they are bonded adhesively to the main body 814 of the carrier device 810. The hollow bodies 825 are formed with a receiving portion 831 on which an eyeglass lens (812', 812"), received in the carrier device 810, bears via the surface (830' 830") facing the main body 814. The hollow bodies 825 act as support members for an eyeglass lens (812', 812") received in the carrier device 810. They are elastically deformable in the direction of the axis 822, thus providing a spring action.

As with the support members 38 in the carrier device 10 in FIG. 1, it is possible to ensure, with the hollow bodies 825, that an eyeglass lens (812', 812") received in the carrier device 810 does not undergo plastic deformation, or at any rate undergoes only very little plastic deformation, when it is heated to the range of the so-called glass transition temperature $T_G$.

Figure 15:
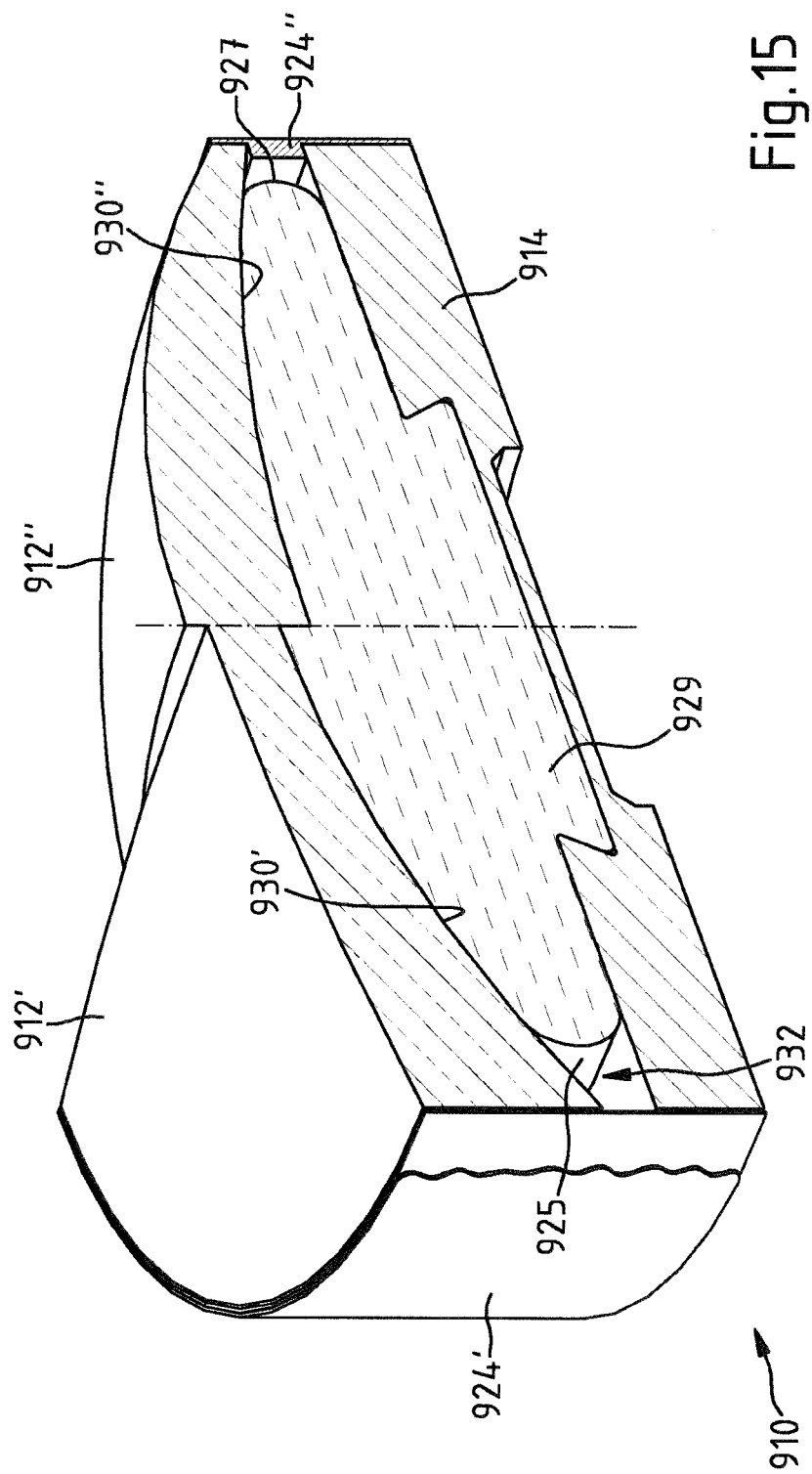

FIG. 15 shows a carrier device 910 for an eyeglass lens that can be designed as a minus-power lens 912' or as a plus-power lens 912". Insofar as the structure of the carrier device 910 corresponds to the structure of the carrier device 10 described with reference to FIG. 1 to FIG. 3, the components of the carrier device 910 are provided with reference signs increased by 900 in relation to FIG. 1, FIG. 2 and FIG. 3. The carrier device 910 likewise comprises a connecting member for connecting a main body 914 to the eyeglass lens (912', 912"). The connecting member can be designed as a plastic adhesive tape 924' or a clamping ring 924". In the hollow space 932, there is a support member in the form of a gel cushion 925, which has an envelope 927 filled with a gel material 929. The gel material 929 is a finely dispersive system having a solid phase and a liquid phase. The solid phase has the effect of a sponge, of which the pores are filled by a liquid or a gas. The gel material 929 can be agar-agar, for example. However, swellable acrylic polymer crystals mixed with water are also suitable in particular as gel material.

When the eyeglass lens is arranged in the carrier device 910, the side of the gel cushion 921 directed toward the eyeglass lens is adapted to the topography of the surface (930', 930") of the eyeglass lens facing into the hollow space. This has the effect that the eyeglass lens is supported in planar fashion on the surface (930', 930") facing into the hollow space. The gel material 929 in the gel cushion 925 can in particular be a magnetostrictive gel material that hardens when exposed to a magnetic field. By applying a magnetic field to the carrier device 910, it is possible, for example, to vary the supporting force for an eyeglass lens received in the carrier device 910 when the eyeglass lens is subjected to a thermal cycle in a finishing process.

Figure 16:
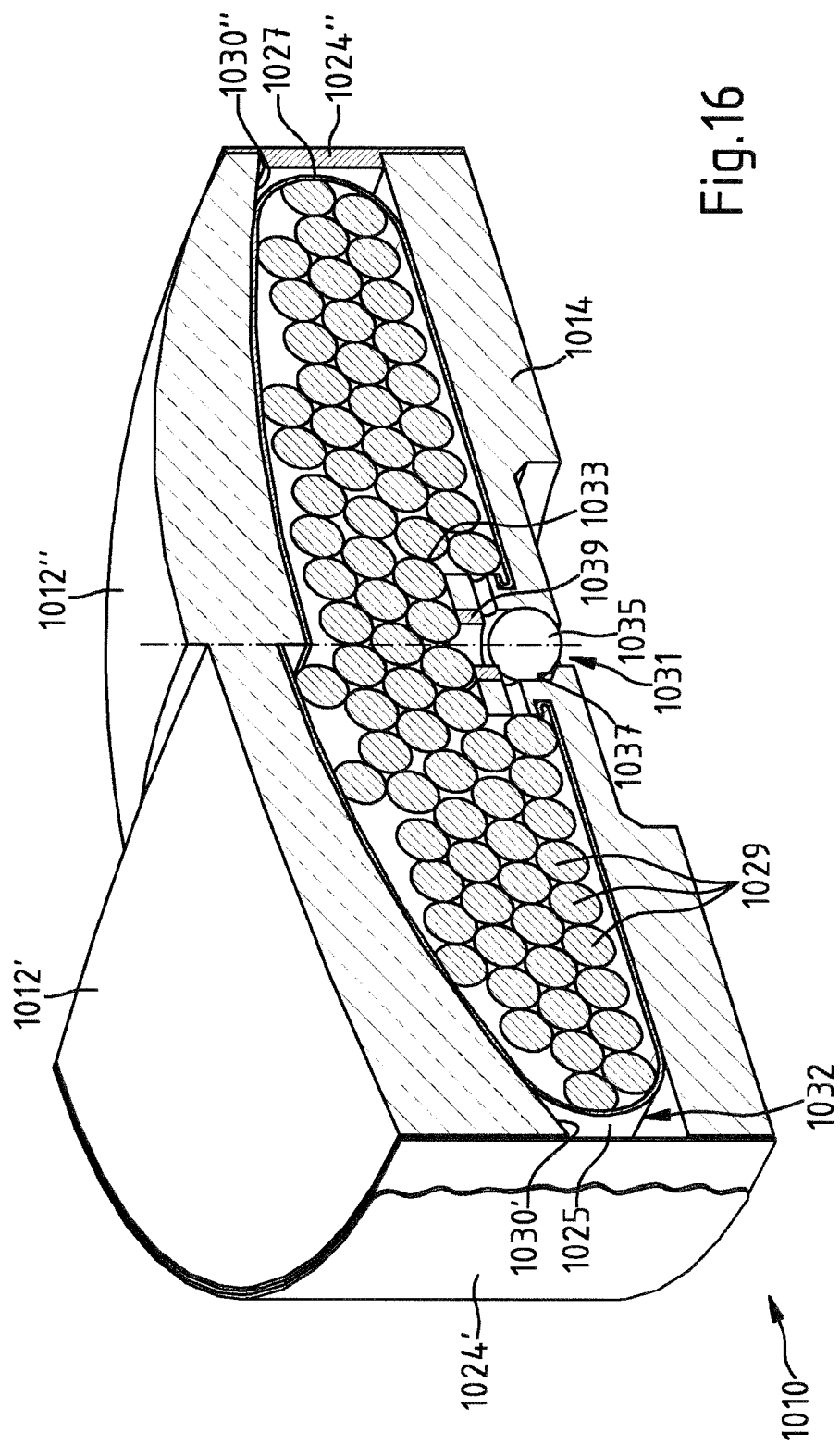

FIG. 16 shows a carrier device 1010 for an eyeglass lens that can be designed as a minus-power lens 1012' or as a plus-power lens 1012". Insofar as the structure of the carrier device 1010 corresponds to the structure of the carrier device 10 described with reference to FIG. 1 to FIG. 3, the components of the carrier device 1010 are provided with reference signs increased by 1000 in relation to FIG. 1, FIG. 2 and FIG. 3. The carrier device 1010 likewise comprises a connecting member for connecting a main body 1014 to the eyeglass lens (1012', 1012"). The connecting member can be designed as a plastic adhesive tape 1024' or a clamping ring 1024". In the hollow space 1032, there is a ball cushion 1025 which acts as a support member with which the eyeglass lens (1012', 1012") in the carrier device 1010 is supported on the main body 1014. The ball cushion 1025 has an envelope 1027, which is filled with a large number of balls 1029 made of plastic or metal, in particular stainless steel. The envelope 1027 has an opening for a valve 1031 integrated in the main body 1014. The valve 1031 has a valve body 1033, in which a closure element in the form of a valve ball 1035 can be moved between a first and a second closure position between a valve seat 1037 and a valve seat 1039. In the first closure position, in which, as can be seen in FIG. 16, the valve ball 1035 is positioned in the valve seat 1037, a gas volume received in the ball cushion 1031 is held back by means of the valve 1031, which gas volume is exposed to an overpressure in relation to the atmosphere. Such a gas volume in the ball cushion 1031 has the effect that the latter is easily deformable, such that, when an eyeglass lens is arranged in the carrier device 1010, the ball cushion conforms in shape to the surface (1030', 1030") of the eyeglass lens facing into the hollow space 1032. When the eyeglass lens is positioned in the carrier device 1010, an underpressure can be generated in the ball cushion 1025 by means of the gas volume received in the ball cushion 1025 being suctioned when the valve 1031 formed in the main body 1014 is attached to a suction device (not shown). Such an underpressure has the effect that the balls 1029 in the ball cushion are pressed tightly onto each other. In this way, the ball cushion can be stiffened in the shape in which, in the area facing the eyeglass lens 1012, it has a shape corresponding to the topography of the surfaces (1030', 1030"). By means of an underpressure generated in the ball cushion 1031, the valve ball 1035 in the valve seat 1039 is held in the second closure position. This ensures that an underpressure generated in the ball cushion 1031 is maintained when the eyeglass lens undergoes a finishing process, for example.

Figure 17:
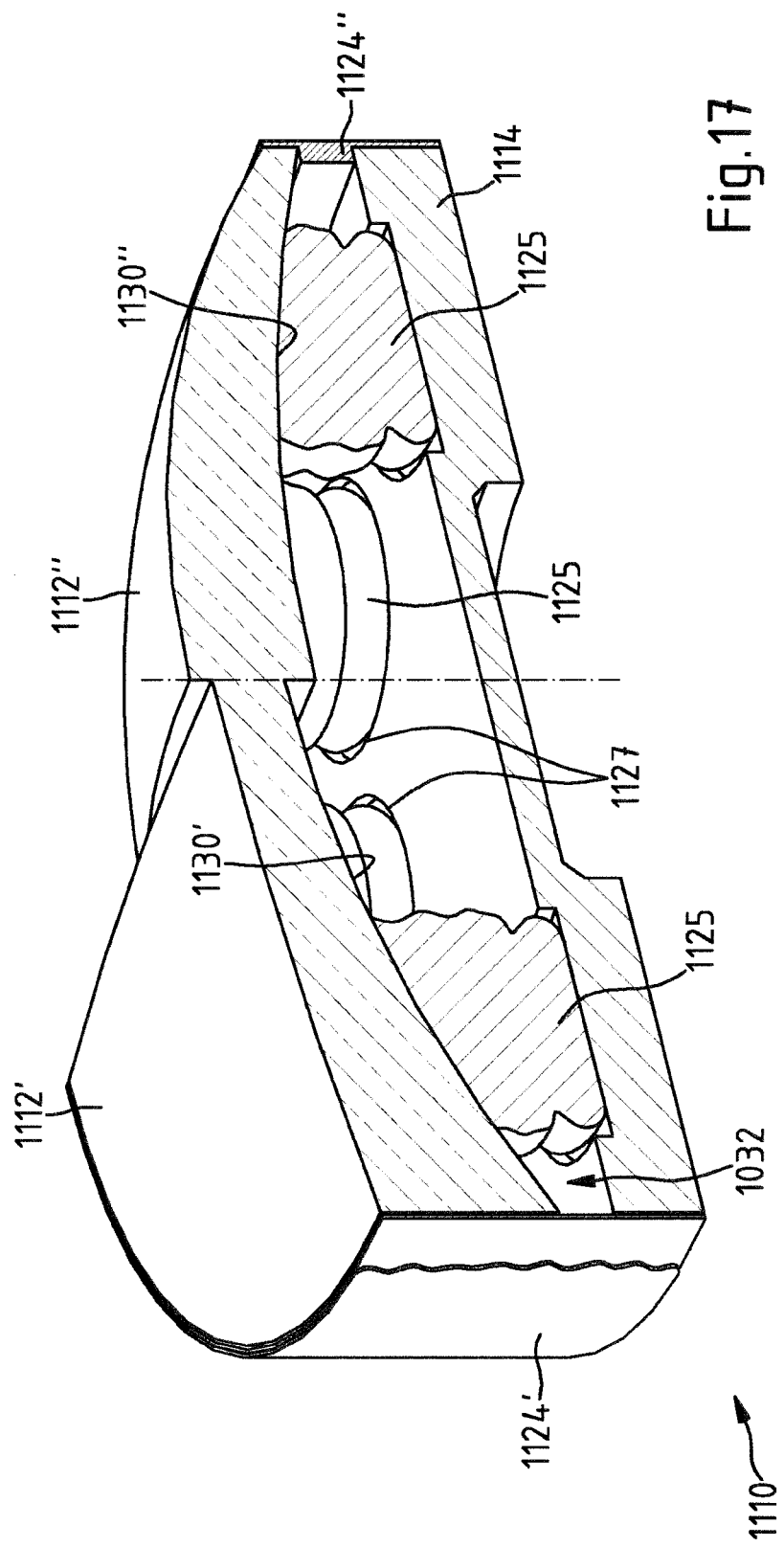

FIG. 17 shows a carrier device 1110 for an eyeglass lens that can be designed as a minus-power lens 1112' or as a plus-power lens 1112". Insofar as the structure of the carrier device 1110 corresponds to the structure of the carrier device 10 described with reference to FIG. 1 and FIG. 2, the components of the carrier device 1110 are provided with reference signs increased by 1100 in relation to FIG. 1 and FIG. 2. The carrier device 1110 likewise comprises a connecting member for connecting a main body 1114 to the eyeglass lens (1112', 1112"). The connecting member can be designed as a plastic adhesive tape 1124' or a clamping ring 1124". In the hollow space 1132, there are a large number of plastic bodies 1125 which act as support members and with which the eyeglass lens (1112', 1112") received in the carrier device 1110 is supported on the main body 1114. The plastic bodies 1125 are arranged in recessed portions 1127 formed on that side of the main body 1114 facing into the hollow space 1132. The plastic bodies 1125 are made from UV adhesive which, after an eyeglass lens has been arranged in the carrier device 1110, is hardened by exposure to UV light through the eyeglass lens. For receiving it in the carrier device 1110, an eyeglass lens is pressed against adhesive tracks of UV adhesive that are applied to the recessed portions 1127 of the main body. The eyeglass lens is then secured with the plastic adhesive tape 1124' or with the clamping ring 1124" on the main body 1114.

Figure 18:
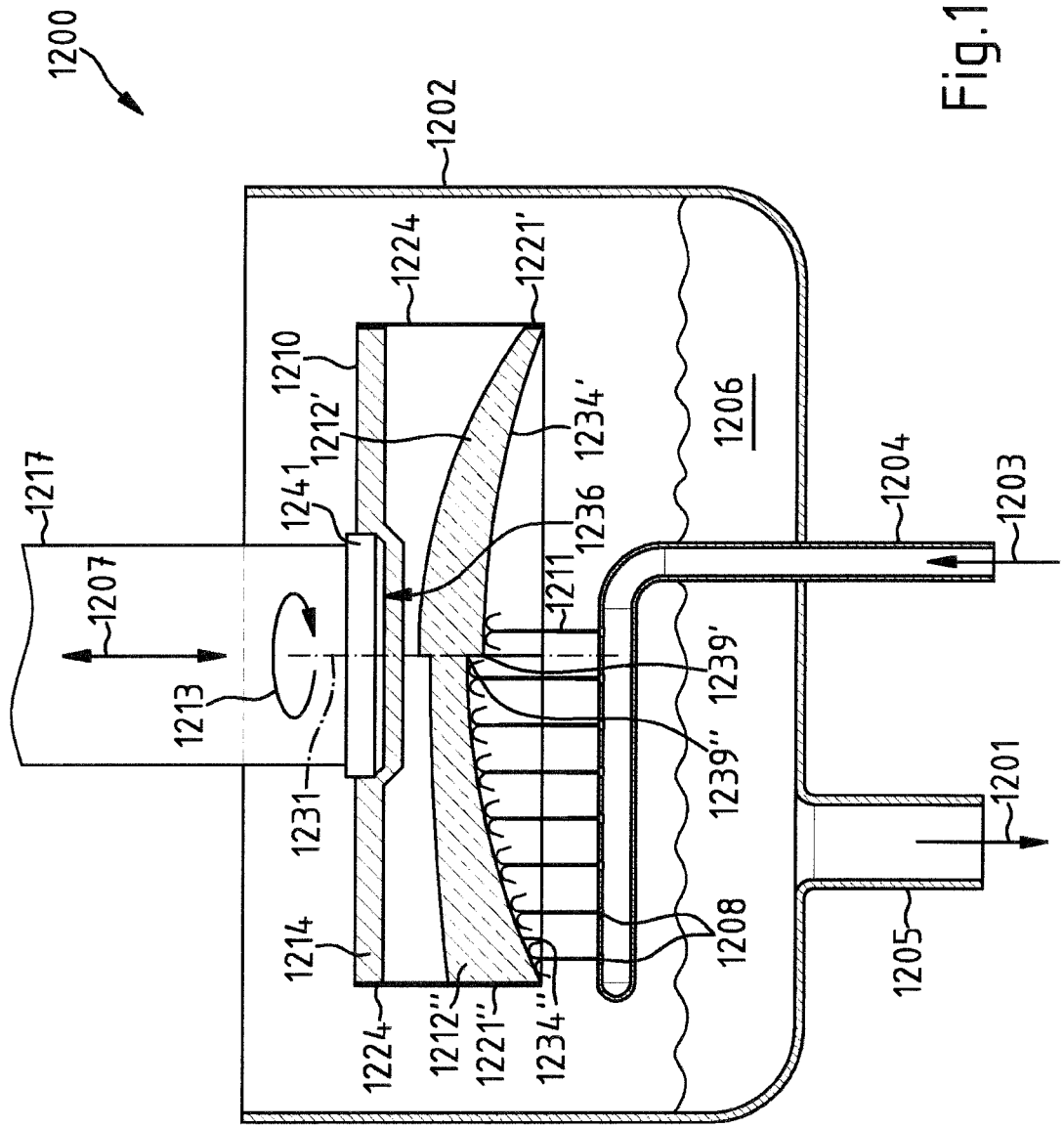
FIG. 18 shows the spray-coating of an eyeglass lens received on a carrier device; and, FIG. 19 shows the immersion-coating of an eyeglass lens in a carrier device.

FIG. 18 shows an eyeglass lens processing system 1200 designed as a coating installation for spray coating. In the processing system 1200, an eyeglass lens designed as a plus-power lens 1212' or as a minus-power lens 1212" is held with a carrier device 1210. Insofar as the structure of the carrier device 1210 corresponds to the structure of the carrier device 10 described with reference to FIG. 1 to FIG. 3, the components of the carrier device 1210 are provided with reference signs increased by 1200 in relation to FIG. 1, FIG. 2 and FIG. 3.

The carrier device 1210 in the processing system is attached to a spindle 1217 which can move in the direction of the double arrow 1207 and which has a coupling member 1241 designed as a suction cup. The coupling member 1241 receives the carrier device 1210 on an attachment member 1236 formed on the main body 1214. The attachment member 1236 is a recess for the suction cup 1241, with which the carrier system 1210 can be secured on the spindle 1217 under the effect of underpressure. The processing system 1200 has a fluid container 1202 with a conduit 1204 for a coating fluid 1206, in which conduit several nozzles 1208 are formed.

The coating fluid 1206 in the conduit 1204 is at a defined pressure in order to generate fluid jets 1211 which issue from the nozzle 1208 and which are directed onto the surface (1234', 1234") of the eyeglass lens (1212' 1212"), in order to apply a layer of fluid to the surface (1234', 1234"). The surface (1234', 1234") of the eyeglass lens (1212', 1212") in the carrier device 1210 is an optically active surface with a concave shape. In an eyeglass frame, this surface is directed away from the eye of the person wearing the eyeglass frame.

To ensure that the layer of fluid applied to the eyeglass lens (1212', 1212") in the eyeglass lens processing system 1200 adheres to the surface (1234', 1234") with a uniform layer thickness, the carrier device 1210 on the spindle 1217 is rotated, according to the arrow 1213, about a rotation axis 1231 extending through the vertex (1239', 1239"), in order to drive the coating fluid 1206, under the effect of the centrifugal force, to the edge (1221', 1221") of the eyeglass lens (1212', 1212"). The coating fluid 1206 in the eyeglass lens processing system 1200 is circulated by a pump mechanism (not shown) through a conduit 1205 and the conduit 1204 in the direction of flow indicated by the arrows (1201, 1203).

The method is for wet-coating an eyeglass lens with a processing system which includes a fluid container for holding the fluid for wet-coating the eyeglass lens and a packaging system which defines a rotational axis and includes a carrier device and the eyeglass lens accommodated thereon. The eyeglass lens has first and second lens surfaces and a lateral peripheral edge delimiting the first and second lens surfaces and defining an edge surface extending between the first and second lens surfaces. The carrier device includes: a main body; a singular annular connecting member directly contact engaging both the main body and the lens and being configured to releasably connect the main body to the lens. The lens is accommodated in the carrier device so as to cause the first lens surface to face toward the main body and the second lens surface to face away from the main body. The main body and the connecting member conjointly define a protective cover surrounding the first lens surface thereof facing toward the main body. The connecting member is in contact engagement with all of the edge surface when the lens is held in the carrier device so as to protect the edge surface from damage during the handling of the lens. The connecting member is one of: an adhesive tape placed around the lateral edge of the lens and a clamping ring engaging around the lateral edge of the lens. The fluid container includes a conduit having several nozzles for directing the fluid to the second lens surface.

The method for wet-coating the eyeglass lens includes the above processing system and the following steps:

lowering the packaging system into the fluid container above the nozzles of the conduit and the surface of the fluid; and, moving fluid from the fluid container into the conduit and through the nozzles toward the second surface of the eyeglass lens while simultaneously rotating the packaging system about the rotational axis to drive the coating fluid under the effect of centrifugal force to the edge of the eyeglass lens thereby ensuring that the layer of fluid applied to the eyeglass lens adheres to the second surface with a uniform layer thickness.

Figure 19:
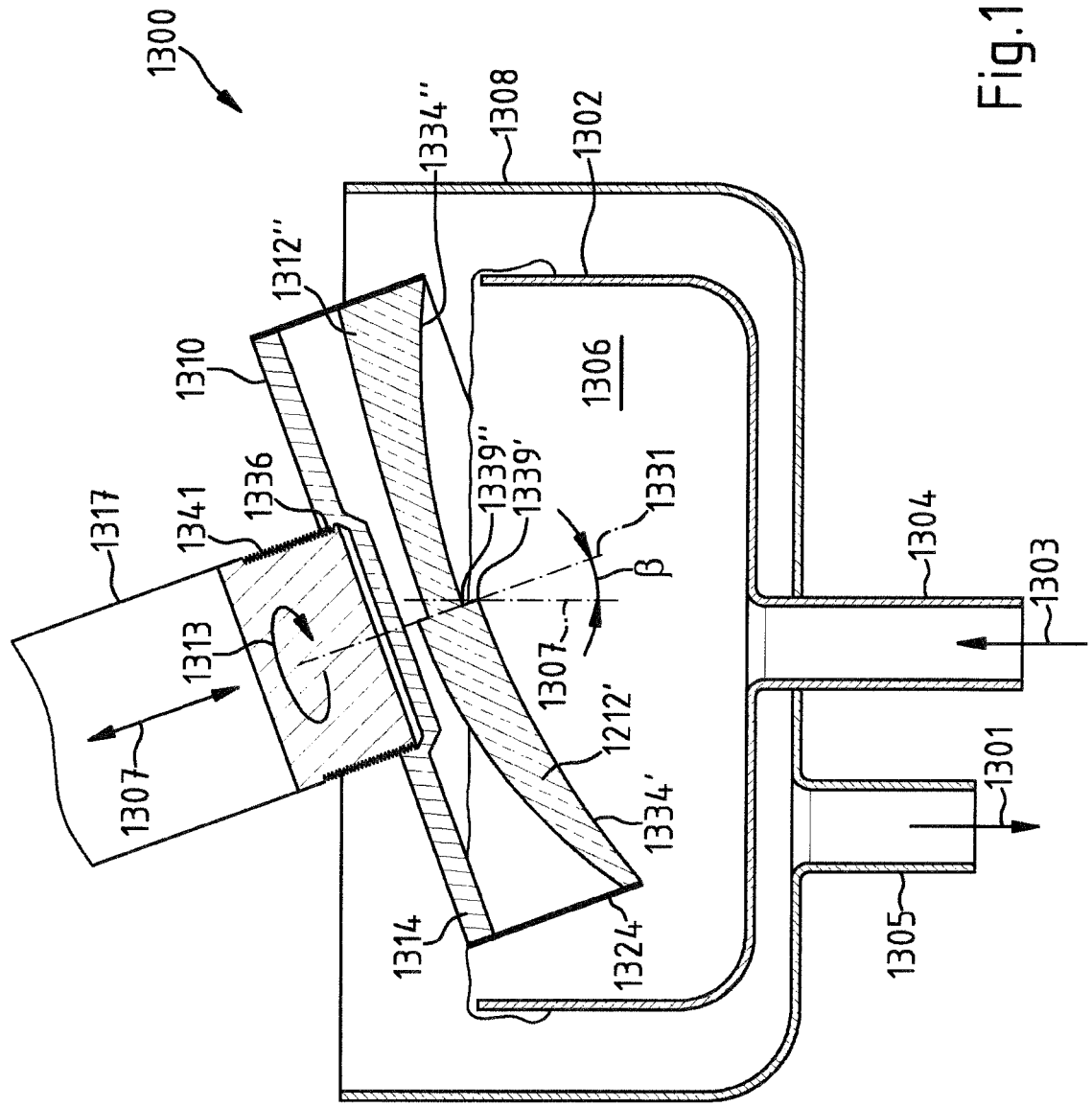

FIG. 19 shows an eyeglass lens processing system 1300 designed as a coating installation for spray coating. In the processing system 1300, an eyeglass lens designed as a plus-power lens 1312' or as a minus-power lens 1312" is held with a carrier device 1310. Insofar as the structure of the carrier device 1310 corresponds to the structure of the carrier device 10 described with reference to FIG. 1 to FIG. 3, the components of the carrier device 1310 are provided with reference signs increased by 1300 in relation to FIG. 1, FIG. 2 and FIG. 3.

The carrier device 1310 in the eyeglass lens processing system 1300 is attached to a spindle 1317 which can move in the direction of the double arrow 1307 and which has a coupling member 1341 designed as an outer thread. The coupling member 1341 receives the carrier device 1310 on an attachment member 1336 formed on the main body 1314, which attachment member 1336 is a recess with an inner thread that engages in the outer thread of the spindle 1317. The processing system 1300 has a fluid container 1302 which can be filled with a coating fluid 1306 via a conduit 1304. In the processing system 1300, the coating fluid 1306 flows from the fluid container 1302 into the fluid container 1308, in order then to be circulated through a conduit 1305 by a pump system (not shown). The coating fluid 1306 is then fed once again into the fluid container 1302 with a flow device indicated by means of the arrows (1301, 1303). In the processing system 1300, the carrier device 1310 received on the spindle 1317 with an eyeglass lens (1312', 1312") is immersed obliquely into the coating fluid 1306 in the fluid container 1302. The surface (1334', 1334") of the eyeglass lens (1312', 1312") shown in FIG. 19 is concave. In an eyeglass frame, the surface (1334', 1334") is directed toward the eye of a person wearing the eyeglass frame.

In the eyeglass lens processing system 1300, the eyeglass lens (1312', 1312") is coated with the coating fluid 1306 as far as the vertex (1339', 1339") of the surface (1334', 1334"). To ensure that the layer of fluid applied to the eyeglass lens (1312', 1312") in the eyeglass lens processing system 1300 adheres to the surface (1334', 1334") with a uniform layer thickness, the axis 1331 inclined with respect to the vertical 1307 by an angle β of, for example, β=20° is rotated. The coating fluid 1306 is in this way driven, under the effect of the centrifugal force, to the edge (1321', 1321") of the eyeglass lens (1312', 1312").

In summary, the following preferred features of the invention are noted in particular: The invention relates to a carrier device 10 for handling a lens 12 which is received therein and which has a lateral edge 21, in particular for handling an eyeglass lens 12 in a machining or finishing process. The carrier device comprises a main body 14 and has a connecting member 24 for releasably connecting the main body 14 to the received lens 12. The connecting member 24 forms, with the main body 14, a protective cover 15 surrounding the lateral edge 21 of the received lens 12 and a surface 30 of the received lens 12 directed toward the main body 14. The connecting member 24 is releasably connected to the main body 14.

Thus, FIG. 19 shows still another embodiment of the method for wet-coating an eyeglass lens. Here, the method is performed with a processing system for wet-coating the eyeglass lens with a fluid and a packaging system which defines a rotational axis and includes a carrier device and the eyeglass lens accommodated thereon. The eyeglass lens has first and second lens surfaces and a lateral peripheral edge delimiting the first and second lens surfaces and defining an edge surface extending between the first and second lens surfaces. The carrier device includes: a main body; a singular annular connecting member directly contact engaging both the main body and the lens and being configured to releasably connect the main body to the lens.

The lens has a vertex and is accommodated in the carrier device so as to cause the first lens surface to face toward the main body and the second lens surface to face away from the main body. The main body and the connecting member conjointly define a protective cover surrounding the first lens surface thereof facing toward the main body. Preferably, the connecting member is in contact engagement with all of the edge surface when the lens is held in the carrier device so as to protect the edge surface from damage during the handling of the lens. The connecting member is one of: an adhesive tape placed around the lateral edge of the lens and a clamping ring engaging around the lateral edge of the lens. The processing system includes a container defining a vertical axis and is configured for receiving and holding the fluid for wet-coating the second lens surface of the eyeglass lens and a circulating arrangement for circulating the fluid through the container.

The method includes the following steps: circulating the fluid through the container; immersing the carrier device with the eyeglass lens obliquely into the fluid so as to cause the rotational axis and the vertical axis to conjointly define an angle β and so as to cause the eyeglass lens to be immersed up to the vertex thereof; and, rotating the carrier device with the eyeglass lens about the rotational axis so as to drive the fluid under the effect of centrifugal force to the edge of the eyeglass lens.

It is understood that the foregoing description is that of the preferred embodiments of the invention and that various changes and modifications may be made thereto without departing from the spirit and scope of the invention as defined in the appended claims.

LIST OF REFERENCE SIGNS 10 carrier device
11 packaging system
12 eyeglass lens
14 main body
15 protective cover
15' bottom surface
16 edge surface, axis
17 spindle
18, 20 edge, circumferential contour
19 machining and/or lighting system
21 edge
22 axis, edge
23 edge
24 axis, connecting member, adhesive tape
25 narrow side
26 portion
27 electric motor 29 control mechanism
30 surface
31 rotation axis
32 hollow space, surface
33 portion
34 surface
35 edge
36 recess
37 tangent
39 vertex
38 support element, support member
40 annular spring
41 coupling member
42 pin, lacquer
43 front face
44 clamping shoe
45 groove
46 Allen screw
47 ring
49 surface portion
50 information carrier
50' mechanism
51 data matrix code
52 lacquer
53, 55 positional reference point
54 axis
56 shaft
57 coordinates system
58 centering mandrel
60 dosing system
62 hollow needle
62 lacquer layer
64 layer
65 theoretical spherical surface
66 arrow
67 interface
68 bead
69 calotte
70 run
72 rim
74 lacquer run
80 installation
82 station
84 suction cup
86, 88 manipulator
87 axis
90 cutting mechanism
91 cutting knife
92 drive
96 measuring device
98 plane
99 contour
100 installation
102-148 processing station, cleaning station
106 polishing station
150 conveying system
151 arrow
152 gate
156 dosing system
158 flushing device
160 polishing tool
162 cleaning medium
163 brushing tool
164, 166 nozzle system
167 air stream
168 measuring system
170 laser light
172 z-height
174 bottom surface
174' adhesion promoter
176 flow
178 nozzle system
180 functional lacquer
182 lacquer bath
184 UV light
186 irradiating device
188 circulating system
190 high-voltage system
192 spindle
194 mechanism
196 dosing system
198 protective lacquer
200 gate
204, 206, 208 layer
210, 220 anti-reflection layer
212, 213, 214 layer
214, 224 anti-fogging layer
216, 218, 222 layer
310 carrier device
312 eyeglass lens
314 main body
315 edge
321 edge surface
324 clamping ring
325 front face
326 edge surface or front end face
328, 329 portion
330 surface
332 hollow space
334 surface
410 carrier device
412' minus-power lens, eyeglass lens
412" plus-power lens, eyeglass lens
412', 412" eyeglass lens
414 main body
415 opening
417 opening
419, 421 arrow
424' plastic adhesive tape
424" clamping ring
424 axis
430', 430" surface
432 hollow space
434', 434" surface
436 seat, interface
437 groove
442 hollow space
446 shaft, receiving unit
447 sealing ring
448 fluid channel
502 hollow space
510 carrier device
512', 512" eyeglass lens
514 main body
515 overpressure valve
517 valve ball
519 valve seat, valve space
521 opening
523, 525 fluid channel
530', 530" surface
532 hollow space
536 seat
542 hollow space
610 carrier device 612' minus-power lens, eyeglass lens
612" plus-power lens, eyeglass lens
614 main body
624', 624" plastic adhesive tape, clamping ring
624 hollow space
625 support member
627 portion
629 spring tongue
630', 630" surface
631 portion
632 hollow space
649 surface
710 carrier device
712' minus-power lens, eyeglass lens
712" plus-power lens, eyeglass lens
714 main body
715 double arrow
724 hollow space
724' plastic adhesive tape
724" clamping ring
725 spring mechanism
727 spring mechanism
729 support body
730', 730" surface
731 circumferential surface
733 dome, bore
735 piston
737 sealing ring
739 gas cushion
810 carrier device
812' minus-power lens, eyeglass lens
812" plus-power lens, eyeglass lens
814 main body
822 axis
824' adhesive tape
824" clamping ring
825 hollow bodies
827 wall
829 attachment portion
830', 830" surface
831 receiving portion
832 hollow space
810 carrier device
910 carrier device
912' minus-power lens, eyeglass lens
912" plus-power lens, eyeglass lens
914 main body
921 gel cushion
924' adhesive tape
924" clamping ring
925 gel cushion
927 envelope
929 gel material
930', 930" surface
932 hollow space
1010 carrier device
1012' minus-power lens, eyeglass lens
1012" plus-power lens, eyeglass lens
1012', 1012" eyeglass lens
1014 main body
1024' plastic adhesive tape
1024" clamping ring
1025 ball cushion
1027 envelope
1029 balls
1030', 1030" surface
1031 valve
1031 ball cushion
1032 hollow space
1033 valve body
1035 valve ball
1037, 1039 valve seat
1110 carrier device
1112' minus-power lens, eyeglass lens
1112" plus-power lens, eyeglass lens
1114 main body
1124' plastic adhesive tape
1124" clamping ring
1125 plastic bodies
1127 portions
1130', 1130" surface
1132 hollow space
1200 eyeglass lens machining system
1201, 1203 arrow
1202 fluid container
1204, 1205 conduit
1206 coating fluid
1207 double arrow
1208 nozzle
1210 carrier device
1211 fluid jets
1212' plus-power lens, eyeglass lens
1212" minus-power lens, eyeglass lens
1213 arrow
1214 main body
1217 spindle
1231 rotation axis
1221', 1221" edge
1234', 1234" surface
1236 attachment member
1239', 1239" vertex
1241 coupling member
1300 eyeglass lens machining system
1301, 1303 arrow
1302 fluid container
1304, 1305 conduit
1306 coating fluid
1307 double arrow, vertical
1308 fluid container
1310 carrier device
1312' plus-power lens, eyeglass lens
1312" minus-power lens, eyeglass lens
1314 main body
1317 spindle
1321', 1321" edge
1331 axis
1334', 1334" surface
1336 attachment member
1339', 1339" vertex
1341 coupling member

What is claimed is:

1. A method for finishing an eyeglass lens with a packaging system which includes a carrier device and the eyeglass lens accommodated thereon, the eyeglass lens having first and second lens surfaces and a lateral peripheral edge delimiting said first and second lens surfaces and defining an edge surface extending between said first and second lens surfaces;

the carrier device including:
a main body;
a singular annular connecting member directly contact engaging both said main body and said lens and being configured to releasably connect said main body to said lens;

said lens being accommodated in said carrier device so as to cause said first lens surface to face toward said main body and said second lens surface to face away from said main body;

said main body and said connecting member conjointly defining a protective cover surrounding said first lens surface thereof facing toward said main body;

said connecting member being in contact engagement with said edge surface when said lens is held in said carrier device; and, said connecting member being one of: an adhesive tape placed around the lateral edge of the lens and a clamping ring engaging around the lateral edge of the lens;

the method comprising the step of:

moving said packaging system to a processing station configured as a coating station and coating said second lens surface in said coating station.

2. The method of claim 1, further comprising the step of removing the adhesive tape or clamping ring and then inverting the eyeglass lens so as to cause the second surface thereof to face toward the main body and the first surface thereof to face away from the main body;

reapplying the adhesive tape or clamping ring to secure the eyeglass lens in place on the main body; and, moving said packaging system to a processing station configured as a coating station and coating said first surface.

3. The method of claim 2, wherein said coating is a hard lacquer coating.

4. The method of claim 3, further comprising the step of moving said packaging system to a processing station and there activating or conditioning said first surface in order to increase adhesion.

5. The method of claim 4, further comprising the step of moving said packaging system to a processing station and there providing an anti-reflection coating.

6. The method of claim 4, further comprising the step of moving said packaging system to a processing station and there providing an anti-reflection layer on said coating.

7. The method of claim 5, wherein said anti-reflection layer is produced by means of chemical wet-coating or by means of physical vapor deposition.

8. The method of claim 2, further comprising the step of moving said packaging system to a processing station and there activating or conditioning said first surface in order to increase adhesion.

9. The method of claim 1, wherein said coating is a hard lacquer coating.

10. The method of claim 9, further comprising the steps of:

removing the adhesive tape or clamping ring and then inverting the eyeglass lens so as to cause the second surface thereof to face toward the main body and the first surface thereof to face away from the main body;

reapplying the adhesive tape or clamping ring to secure the eyeglass lens in place on the main body; and, moving said packaging system to a processing station configured as a coating station and coating said first surface.

11. The method of claim 9, further comprising the step of moving said packaging system to a processing station and there activating or conditioning said second lens surface in order to increase adhesion prior to coating said second lens surface.

12. The method of claim 1, further comprising the step of moving said packaging system to a processing station and there activating or conditioning said second lens surface in order to increase adhesion prior to coating said second lens surface.

13. The method of claim 12, further comprising the steps of:

removing the adhesive tape or clamping ring and then inverting the eyeglass lens so as to cause the second surface thereof to face toward the main body and the first surface thereof to face away from the main body;

reapplying the adhesive tape or clamping ring to secure the eyeglass lens in place on the main body; and, moving said packaging system to a processing station configured as a coating station and coating said first surface.

14. The method of claim 1, further comprising the step of moving said packaging system to a processing station and there providing an anti-reflection coating.

15. The method of claim 14, wherein said anti-reflection layer is produced by means of chemical wet-coating or by means of physical vapor deposition.

16. The method of claim 1, further comprising the step of moving said packaging system to a processing station and there providing an anti-reflection layer on said coating.

17. The method of claim 16, wherein said anti-reflection layer is produced by means of chemical wet-coating or by means of physical vapor deposition.

18. The method of claim 1, wherein said eyeglass lens defines an axis perpendicular to said first and second lens surfaces; and, said lens is accommodated in said carrier device so as to cause said first lens surface to be in spaced relationship to said main body measured along said axis.

19. A method for wet-coating an eyeglass lens with a processing system including a fluid container for holding the fluid for wet-coating the eyeglass lens and a packaging system which defines a rotational axis and includes a carrier device and the eyeglass lens accommodated thereon, the eyeglass lens having first and second lens surfaces and a lateral peripheral edge delimiting said first and second lens surfaces and defining an edge surface extending between said first and second lens surfaces;

the carrier device including:

a main body;

a singular annular connecting member directly contact engaging both said main body and said lens and being configured to releasably connect said main body to said lens;

said lens being accommodated in said carrier device so as to cause said first lens surface to face toward said main body and said second lens surface to face away from said main body;

said main body and said connecting member conjointly defining a protective cover surrounding said first lens surface thereof facing toward said main body;

said connecting member being in contact engagement with said edge surface when said lens is held in said carrier device;

said connecting member being one of: an adhesive tape placed around the lateral edge of the lens and a clamping ring engaging around the lateral edge of the lens; and, said fluid container including a conduit having several nozzles for directing said fluid to said second lens surface;

the method comprising the following steps:

lowering said packaging system into said fluid container above said nozzles of said conduit and the surface of said fluid; and, moving fluid from said fluid container into said conduit and through said nozzles toward said second surface of said eyeglass lens while simultaneously rotating said packaging system about said rotational axis to drive said coating fluid under the effect of centrifugal force to the edge of the eyeglass lens thereby ensuring that the layer of fluid applied to the eyeglass lens adheres to said second surface with a uniform layer thickness.

20. A method for coating an eyeglass lens with a processing system including a vapor deposition system for vapor depositing a coating on the eyeglass lens and a packaging system which includes a carrier device and the eyeglass lens accommodated thereon, the eyeglass lens having first and second lens surfaces and a lateral peripheral edge delimiting said first and second lens surfaces and defining an edge surface extending between said first and second lens surfaces and each of said first and second lens surfaces defining a surface centroid;

the carrier device including:
a main body;
a singular annular connecting member directly contact engaging both said main body and said lens and being configured to releasably connect said main body to said lens;
said lens being accommodated in said carrier device so as to cause said first lens surface to face toward said main body and said second lens surface to face away from said main body;
said main body and said connecting member conjointly defining a protective cover surrounding said first lens surface thereof facing toward said main body;
said connecting member being in contact engagement with said edge surface when said lens is held in said carrier device;
said connecting member being one of: an adhesive tape placed around the lateral edge of the lens and a clamping ring engaging around the lateral edge of the lens; and,
said vapor deposition system including a calotte having an inner surface and a vapor deposition device for directing vaporized coating material to said second lens surface;
the method comprising the following steps:
attaching a plurality of said packaging systems to said inner surface of said calotte so as to cause the second lens surface to face toward said vapor deposition device;
adjusting said packing systems so as to cause the centroid of corresponding ones of said second lens surfaces to lie in an imaginary spherical surface concentric with said inner surface of said calotte; and,
simultaneously vapor depositing said coating material onto said second lens surfaces of corresponding ones of said eyeglass lenses.

21. A method for wet-coating an eyeglass lens with a processing system for wet-coating the eyeglass lens with a fluid and a packaging system which defines a rotational axis and includes a carrier device and the eyeglass lens accommodated thereon, the eyeglass lens having first and second lens surfaces and a lateral peripheral edge delimiting said first and second lens surfaces and defining an edge surface extending between said first and second lens surfaces;

the carrier device including:
a main body;
a singular annular connecting member directly contact engaging both said main body and said lens and being configured to releasably connect said main body to said lens;
said lens having a vertex and being accommodated in said carrier device so as to cause said first lens surface to face toward said main body and said second lens surface to face away from said main body;
said main body and said connecting member conjointly defining a protective cover surrounding said first lens surface thereof facing toward said main body;
said connecting member being in contact engagement with said edge surface when said lens is held in said carrier device;
said connecting member being one of: an adhesive tape placed around the lateral edge of the lens and a clamping ring engaging around the lateral edge of the lens; and,
said processing system including a container defining a vertical axis and being configured for receiving and holding the fluid for wet-coating the second lens surface of said eyeglass lens and a circulating arrangement for circulating the fluid through said container; the method comprising the following steps:
circulating the fluid through said container;
immersing said carrier device with said eyeglass lens obliquely into said fluid so as to cause said rotational axis and said vertical axis to conjointly define an angle β and so as to cause the eyeglass lens to be immersed up to said vertex thereof; and,
rotating said carrier device with said eyeglass lens about said rotational axis so as to drive said fluid under the effect of centrifugal force to the edge of the eyeglass lens.

* * * * *